(12) United States Patent
Lee et al.

(10) Patent No.: US 8,916,237 B2
(45) Date of Patent: Dec. 23, 2014

(54) THIN FILM DEPOSITION APPARATUS AND METHOD OF DEPOSITING THIN FILM

(75) Inventors: Choong-Ho Lee, Yongin (KR); Jung-Min Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 890 days.

(21) Appl. No.: 12/784,774

(22) Filed: May 21, 2010

(65) Prior Publication Data

US 2010/0297348 A1   Nov. 25, 2010

(30) Foreign Application Priority Data

May 22, 2009  (KR) .......................... 10-2009-0045199
Aug. 11, 2009  (KR) .......................... 10-2009-0074001
Feb. 17, 2010  (KR) .......................... 10-2010-0014272

(51) Int. Cl.
  *C23C 16/00*  (2006.01)
  *C23C 16/52*  (2006.01)
  *C23C 14/24*  (2006.01)
  *C23C 16/04*  (2006.01)

(52) U.S. Cl.
  CPC ..................................... *C23C 14/24* (2013.01)
  USPC ........................................ 427/248.1; 118/715

(58) Field of Classification Search
  None
  See application file for complete search history.

(56) References Cited

U.S. PATENT DOCUMENTS

| 4,416,217 | A |  | 11/1983 | Nakamura et al. |
| 4,687,939 | A |  | 8/1987 | Miyauchi et al. |
| 4,792,378 | A |  | 12/1988 | Rose et al. |
| 4,901,667 | A |  | 2/1990 | Suzuki et al. |
| 5,184,319 | A | * | 2/1993 | Kramer .............................. 703/5 |
| 5,742,129 | A |  | 4/1998 | Nagayama et al. |
| 6,045,671 | A |  | 4/2000 | Wu et al. |
| 6,093,445 | A | * | 7/2000 | Nawate .......................... 427/128 |
| 6,274,198 | B1 |  | 8/2001 | Dautartas |

(Continued)

FOREIGN PATENT DOCUMENTS

| CN | 1489419 A | 4/2004 |
| CN | 1500904 A | 6/2004 |

(Continued)

OTHER PUBLICATIONS

KIPO Registration Determination Certificate dated Aug. 24, 2012, for Korean Patent application 10-2010-0066993, (5 pages).

(Continued)

*Primary Examiner* — Joseph Miller, Jr.
(74) *Attorney, Agent, or Firm* — Christie, Parker & Hale, LLP

(57) ABSTRACT

A method of manufacturing a thin film on a substrate including: disposing the substrate to be separated from a thin film deposition apparatus by a preset distance; passing vaporized deposition material through first slits of a first nozzle, the first slits arranged in a first direction; passing the vaporized deposition material received from the first slits through second slits of a second nozzle of the thin film deposition apparatus; using an adjusting member including an actuator set to adjust an orientation of the second nozzle relative to a deposition target area on the substrate on which the deposition material from the second nozzle is to be deposited; and depositing the deposition material from the second nozzle onto the deposition target area while the thin film deposition apparatus or the substrate is moved relative to the other, the second nozzle defining a pattern of deposition material on the substrate, is disclosed.

73 Claims, 20 Drawing Sheets

(56) References Cited

U.S. PATENT DOCUMENTS

| | | |
|---|---|---|
| 6,280,821 B1 | 8/2001 | Kadunce et al. |
| 6,371,451 B1 | 4/2002 | Choi |
| 6,417,034 B2 | 7/2002 | Kitazume et al. |
| 6,579,422 B1 * | 6/2003 | Kakinuma ............... 204/192.13 |
| 6,589,673 B1 | 7/2003 | Kido et al. |
| 6,699,324 B1 | 3/2004 | Berdin et al. |
| 6,749,906 B2 | 6/2004 | Van Slyke |
| 6,837,939 B1 | 1/2005 | Klug et al. |
| 6,878,209 B2 | 4/2005 | Himeshima et al. |
| 6,946,783 B2 | 9/2005 | Kim |
| 7,006,202 B2 | 2/2006 | Byun et al. |
| RE39,024 E | 3/2006 | Takahashi |
| 7,078,070 B2 | 7/2006 | Peng |
| 8,137,466 B2 | 3/2012 | Kang et al. |
| 8,188,476 B2 | 5/2012 | Takagi et al. |
| 8,193,011 B2 | 6/2012 | Kang et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0168013 A1 | 9/2003 | Freeman et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0029028 A1 | 2/2004 | Shimizu |
| 2004/0056244 A1 * | 3/2004 | Marcus et al. ............... 257/40 |
| 2004/0086639 A1 * | 5/2004 | Grantham et al. ......... 427/248.1 |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2005/0016461 A1 * | 1/2005 | Klug et al. ................ 118/726 |
| 2005/0031836 A1 | 2/2005 | Hirai |
| 2005/0037136 A1 | 2/2005 | Yamamoto |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0213021 A1 | 9/2005 | Myoung |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0090705 A1 | 5/2006 | Kim |
| 2006/0110544 A1 | 5/2006 | Kim et al. |
| 2006/0113907 A1 | 6/2006 | Im et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0269671 A1 | 11/2006 | Kim et al. |
| 2006/0272572 A1 | 12/2006 | Uematsu et al. |
| 2006/0280588 A1 | 12/2006 | Blonigan et al. |
| 2007/0009552 A1 | 1/2007 | Whitehead et al. |
| 2007/0017445 A1 | 1/2007 | Takehara et al. |
| 2007/0022955 A1 * | 2/2007 | Bender et al. ................ 118/726 |
| 2007/0046185 A1 | 3/2007 | Kim |
| 2007/0054044 A1 | 3/2007 | Shimosaki et al. |
| 2007/0077358 A1 | 4/2007 | Jeong et al. |
| 2007/0148337 A1 | 6/2007 | Nichols et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0231460 A1 | 10/2007 | Ukigaya |
| 2008/0018236 A1 | 1/2008 | Arai et al. |
| 2008/0038935 A1 | 2/2008 | Baude et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0261047 A1 * | 10/2008 | Shibata ..................... 428/411.1 |
| 2008/0309718 A1 | 12/2008 | Oya et al. |
| 2009/0017192 A1 | 1/2009 | Matsuura |
| 2009/0074966 A1 * | 3/2009 | Henderson et al. ........... 427/256 |
| 2009/0165713 A1 | 7/2009 | Kim et al. |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0277386 A1 | 11/2009 | Takagi et al. |
| 2009/0279173 A1 | 11/2009 | Chui et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0165454 A1 | 7/2010 | Suetsugu et al. |
| 2010/0192856 A1 | 8/2010 | Sung et al. |
| 2010/0196607 A1 | 8/2010 | Carlson et al. |
| 2010/0271602 A1 | 10/2010 | Hanazaki |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0123707 A1 | 5/2011 | Lee et al. |
| 2011/0220019 A1 | 9/2011 | Lee et al. |
| 2011/0262625 A1 | 10/2011 | Park et al. |
| 2012/0009328 A1 | 1/2012 | Ryu et al. |
| 2012/0009706 A1 | 1/2012 | Choi et al. |
| 2012/0083061 A1 | 4/2012 | Kang et al. |
| 2012/0145077 A1 | 6/2012 | Chang et al. |
| 2012/0313251 A1 | 12/2012 | Kato |

FOREIGN PATENT DOCUMENTS

| | | |
|---|---|---|
| CN | 1556872 A | 12/2004 |
| CN | 1607868 A | 4/2005 |

(56) References Cited

FOREIGN PATENT DOCUMENTS

| | | |
|---|---|---|
| CN | 1704501 A | 12/2005 |
| CN | 1814854 A | 8/2006 |
| EP | 1 413 644 | 4/2004 |
| EP | 1 418 250 A2 | 5/2004 |
| EP | 1 518 940 | 3/2005 |
| JP | 57-194252 | 11/1982 |
| JP | 2-247372 | 10/1990 |
| JP | 4-272170 | 9/1992 |
| JP | 05-230628 | 9/1993 |
| JP | 08-027568 | 1/1996 |
| JP | 09-095776 | 4/1997 |
| JP | 10-50478 | 2/1998 |
| JP | 2000-68054 | 3/2000 |
| JP | 2001-52862 | 2/2001 |
| JP | 2001-93667 | 4/2001 |
| JP | 2002-075638 | 3/2002 |
| JP | 2002-175878 | 6/2002 |
| JP | 2002-348659 A2 | 12/2002 |
| JP | 2003-3250 | 1/2003 |
| JP | 2003-77662 | 3/2003 |
| JP | 2003-157973 | 5/2003 |
| JP | 2003-197531 | 7/2003 |
| JP | 2003-297562 | 10/2003 |
| JP | 2003-321767 | 11/2003 |
| JP | 2004-035964 | 2/2004 |
| JP | 2004-43898 | 2/2004 |
| JP | 2004-076150 | 3/2004 |
| JP | 2004-76150 A2 | 3/2004 |
| JP | 2004-103269 | 4/2004 |
| JP | 2004-103341 | 4/2004 |
| JP | 2004-137583 | 5/2004 |
| JP | 2004-137583 A2 | 5/2004 |
| JP | 2004-143521 A2 | 5/2004 |
| JP | 2004-169169 | 6/2004 |
| JP | 2004-199919 | 7/2004 |
| JP | 2004-349101 | 12/2004 |
| JP | 2004-355975 | 12/2004 |
| JP | 2005-44592 | 2/2005 |
| JP | 2005-122980 | 5/2005 |
| JP | 2005-165015 | 6/2005 |
| JP | 2005-174843 | 6/2005 |
| JP | 2005-206939 | 8/2005 |
| JP | 2005-235568 | 9/2005 |
| JP | 2005-293968 | 10/2005 |
| JP | 2005-296737 | 10/2005 |
| JP | 2006-028583 | 2/2006 |
| JP | 2006-172930 | 6/2006 |
| JP | 2006-176809 | 7/2006 |
| JP | 2006-210038 | 8/2006 |
| JP | 2006-275433 | 10/2006 |
| JP | 2006-292955 | 10/2006 |
| JP | 2007-47293 | 2/2007 |
| JP | 2007-66862 | 3/2007 |
| JP | 2007-146219 | 6/2007 |
| JP | 2007-186740 | 7/2007 |
| JP | 2007-291506 | 11/2007 |
| JP | 2008-108628 | 5/2008 |
| JP | 2008-121098 | 5/2008 |
| JP | 2008-521165 | 6/2008 |
| JP | 2008-248301 A2 | 10/2008 |
| JP | 2008-300056 | 12/2008 |
| JP | 2009-19243 | 1/2009 |
| JP | 2009-024208 | 2/2009 |
| JP | 2009-049223 | 3/2009 |
| JP | 2009-081165 | 4/2009 |
| JP | 2009-87910 | 4/2009 |
| JP | 2010-261081 | 11/2010 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 10-2001-0059939 | 7/2001 |
| KR | 10-2001-0092914 | 10/2001 |
| KR | 2001-0093666 | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 10-2003-0001745 | 1/2003 |
| KR | 10-2003-0034730 A | 5/2003 |
| KR | 10-2003-0046090 | 6/2003 |
| KR | 2003-0069684 | 8/2003 |
| KR | 10-0405080 | 10/2003 |
| KR | 10-2003-0091947 | 12/2003 |
| KR | 10-2003-0093959 | 12/2003 |
| KR | 10-2003-0094033 | 12/2003 |
| KR | 10-2004-0014258 | 2/2004 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-0463212 | 12/2004 |
| KR | 10-0483487 B1 | 4/2005 |
| KR | 10-2005-0062853 | 6/2005 |
| KR | 10-0520159 | 9/2005 |
| KR | 10-2006-0008602 | 1/2006 |
| KR | 10-2006-0018745 | 3/2006 |
| KR | 10-2006-0018745 A | 3/2006 |
| KR | 10-2006-0020050 | 3/2006 |
| KR | 10-2006-0049050 | 5/2006 |
| KR | 10-2006-0056706 | 5/2006 |
| KR | 10-2006-0058459 | 5/2006 |
| KR | 10-2006-0059068 | 6/2006 |
| KR | 10-2006-0060994 | 6/2006 |
| KR | 10-2006-0065978 | 6/2006 |
| KR | 10-2006-0073367 | 6/2006 |
| KR | 10-2006-0080475 | 7/2006 |
| KR | 10-2006-0080481 | 7/2006 |
| KR | 10-2006-0080481 A | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0104675 A | 10/2006 |
| KR | 10-2006-0104677 | 10/2006 |
| KR | 10-2006-0109627 | 10/2006 |
| KR | 10-0635903 B1 | 10/2006 |
| KR | 10-2006-0114462 A | 11/2006 |
| KR | 10-0645719 B1 | 11/2006 |
| KR | 10-0646160 | 11/2006 |
| KR | 10-2006-0213944 | 12/2006 |
| KR | 10-0687007 | 2/2007 |
| KR | 10-2007-0025164 | 3/2007 |
| KR | 10-0696547 | 3/2007 |
| KR | 10-0696550 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-0711885 | 4/2007 |
| KR | 10-2007-0050793 | 5/2007 |
| KR | 10-0723627 | 5/2007 |
| KR | 10-0726132 | 6/2007 |
| KR | 10-0739309 B1 | 7/2007 |
| KR | 10-2007-0078713 | 8/2007 |
| KR | 10-2007-0080635 | 8/2007 |
| KR | 10-2006-0028115 | 10/2007 |
| KR | 10-2007-0097218 | 10/2007 |
| KR | 10-2007-0101842 | 10/2007 |
| KR | 10-2007-0105595 | 10/2007 |
| KR | 10-0770653 | 10/2007 |
| KR | 10-2007-0112668 | 11/2007 |
| KR | 10-0787457 B1 | 12/2007 |
| KR | 10-2008-0001184 | 1/2008 |
| KR | 10-2008-0003720 | 1/2008 |
| KR | 10-0797787 | 1/2008 |
| KR | 10-0800125 | 1/2008 |
| KR | 10-0815265 | 3/2008 |
| KR | 10-2008-0036983 | 4/2008 |
| KR | 10-0823508 | 4/2008 |

(56) References Cited

FOREIGN PATENT DOCUMENTS

| KR | 10-0827760 | | 4/2008 |
|---|---|---|---|
| KR | 10-2008-0044775 | | 5/2008 |
| KR | 10-2008-0048653 | | 6/2008 |
| KR | 10-2008-0055124 | | 6/2008 |
| KR | 10-0839380 | | 6/2008 |
| KR | 10-2008-0060400 | | 7/2008 |
| KR | 10-2008-0061132 | | 7/2008 |
| KR | 10-2008-0061666 | | 7/2008 |
| KR | 10-2008-0061774 | | 7/2008 |
| KR | 10-2008-0062212 | | 7/2008 |
| KR | 10-2008-0109559 | | 12/2008 |
| KR | 10-0889872 | B1 | 3/2009 |
| KR | 10-2009-0038733 | | 4/2009 |
| KR | 10-2009-0040618 | | 4/2009 |
| KR | 10-2009-0052155 | | 5/2009 |
| KR | 10-2009-0053417 | | 5/2009 |
| KR | 10-2009-0066996 | | 6/2009 |
| KR | 10-2009-0079765 | A | 7/2009 |
| KR | 10-0908232 | B1 | 7/2009 |
| KR | 10-2009-0093161 | | 9/2009 |
| KR | 10-2009-0097453 | | 9/2009 |
| KR | 10-0922763 | A | 10/2009 |
| KR | 10-2010-0000128 | | 1/2010 |
| KR | 10-2010-0000129 | | 1/2010 |
| KR | 10-2010-0002381 | A | 1/2010 |
| KR | 10-2010-0026655 | | 3/2010 |
| KR | 10-2010-0090070 | | 8/2010 |
| KR | 10-2010-0099806 | | 9/2010 |
| KR | 10-2010-0126125 | | 12/2010 |
| KR | 10-2011-0101767 | | 9/2011 |
| KR | 10-2012-0006324 | | 1/2012 |
| KR | 10-2010-0047796 | | 5/2012 |
| KR | 10-2012-0065789 | A | 6/2012 |
| WO | WO 99/25894 | | 5/1999 |
| WO | WO 2008/004792 | A1 | 1/2008 |

OTHER PUBLICATIONS

English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, at al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
KIPO Office action dated Feb. 6, 2012, for Korean Patent application 10-2010-0021835, 4 pages.
KIPO Office action dated Feb. 1, 2012, for Korean Patent application 10-2010-0014272, 4 pages.
KIPO Office action dated Apr. 2, 2012, for Korean priority Patent application 10-2010-0066993, (4 pages).
European Search Report dated Sep. 6, 2010, issued in corresponding European Patent Application No. 10250961.9.
KIPO Office action dated Aug. 1, 2011, for corresponding Korean Patent application 10-2009-0074001, 3 pages.
Patent Abstracts of Japan, and English machine translation of Japanese Publication 2009-024208, pages.
U.S. Appl. No. 13/031,756, filed Feb. 22, 2011, Yong Sup Choi et al., Samsung Mobile Display Co., Ltd.
JPO Office action dated Mar. 26, 2013, for corresponding Japanese Patent application 2010-116507, (4 pages).
Patent Abstracts of Japan, and English machine translation of Japanese Publication 2004-349101, dated Dec. 9, 2004, (11 pages).
KIPO Registration Determination Certificate dated Oct. 31, 2011 for Korean Patent application 10-2010-0014273, (5 pages).
KIPO Office action dated Feb. 6, 2012 for Korean Patent application 10-2010-0014274, (9 pages).
KIPO Office action dated Aug. 28, 2012 for Korean Patent application 10-2010-0014274, (5 pages).
KIPO Notice of Allowance dated Sep. 28, 2011 for Korean Patent application 10-2009-0052357, (5 pages).
KIPO Notice of Allowance dated Nov. 25, 2011 for Korean Patent application 10-2010-0014277, (5 pages).
KIPO Office action dated Feb. 1, 2012 for Korean Patent application 10-2010-0011196, (4 pages).
KIPO Office action dated Feb. 1, 2012 for Korean Patent application 10-2010-0013848, (4 pages).
KIPO Office action dated Jan. 13, 2012 for Korean Patent application 10-2009-0056529, (5 pages).
KIPO Notice of Allowance dated Jul. 20, 2012 for Korean Patent application 10-2010-0003545, (5 pages).
KIPO Notice of Allowance dated Apr. 30, 2012 for Korean Patent application 10-2010-0066992, (5 pages).
JPO Office action dated Aug. 21, 2012 for Japanese Patent application 2010-145075, (5 pages).
KIPO Office action dated Sep. 1, 2012 for Korean Patent application 10-2010-0010136, (5 pages).

(56) References Cited

OTHER PUBLICATIONS

KIPO Notice of Allowance dated Sep. 1, 2012 for Korean Patent application 10-2010-0013848, (5 pages).
KIPO Notice of Allowance dated Sep. 1, 2012 for Korean Patent application 10-2010-0009160, (5 pages).
KIPO Notice of Allowance dated Sep. 1, 2012 for Korean Patent application 10-2010-0014276, (5 pages).
JPO Office action dated Sep. 4, 2012 for Japanese Patent application 2010-152846, (4 pages).
U.S. Office Action dated Sep. 12, 2012 for cross reference U.S. Appl. No. 12/815,673, (26 pages).
U.S. Office Action dated Dec. 26, 2012 for cross reference U.S. Appl. No. 12/794,093, (31 pages).
U.S. Office Action dated Dec. 17, 2012 for cross reference U.S. Appl. No. 12/873,556, (37 pages).
U.S. Office Action dated Jan. 25, 2013 for cross reference U.S. Appl. No. 13/015,357, (21 pages).
U.S. Office Action dated Dec. 26, 2012 for cross reference U.S. Appl. No. 12/815,673, (21 pages).
U.S. Notice of Allowance dated Mar. 18, 2013 for cross reference U.S. Appl. No. 12/795,001, (29 pages).
U.S. Office action dated Mar. 15, 2013 for cross reference U.S. Appl. No. 12/813,786, (33 pages).
U.S. Office action dated Mar. 19, 2013 for cross reference U.S. Appl. No. 13/194,759, (36 pages).
U.S. Office action dated Mar. 18, 2013 for cross reference U.S. Appl. No. 12/984,231, (29 pages).
U.S. Office action dated Mar. 22, 2013 for cross reference U.S. Appl. No. 12/987,569, (12 pages).
SIPO Office action dated Mar. 11, 2014, corresponding to Chinese Patent application 201010189581.X, (9 pages).
Arnold, M. et al. Direct vapor jet printing of three color segment organic light emitting devices for white light illumination, Applied Physics Letters, vol. 92, (2008), pp. 053301-053303.
European Search Report dated May 13, 2011 for European Application No. 11250019.4 (6 pages).
European Search Report dated May 20, 2011 for European Application No. 10251404.9 (12 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Aug. 24, 2012, issued to KR 10-2010-0066993 (5 pages).
KIPO Notice of Allowance dated Oct. 27, 2011 for Korean Application No. 10-2010-0002381 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
Korean Registration Certificate dated Sep. 28, 2011 for Korean Application No. 10-2009-0045200 (5 pages).
SIPO Certificate of Patent dated Jul. 31, 2013, corresponding to Chinese Patent application 201110029291.3, (31 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Jan. 27, 2014 for U.S. Appl. No. 12/987,569 (9 pages).
U.S. Notice of Allowance dated May 9, 2014 for U.S. Appl. No. 13/194,759 (27 pages).
U.S. Office action dated Aug. 13, 2013, issued to U.S. Appl. No. 13/194,759, (28 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 16, 2013 for U.S. Appl. No. 14/054,536 (35 pages).
U.S. Office action dated Feb. 11, 2014, for cross reference U.S. Appl. No. 13/178,472 (8 pages).
U.S. Office action dated Feb. 6, 2014, for U.S. Appl. No. 12/984,231 (16 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 26, 2013, issued to U.S. Appl. No. 12/794,093 (20 pages).
U.S. Office Action dated Mar. 23, 2012 for U.S. Appl. No. 12/849,193 (17 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
Yang, et al., Organic/polymeric electroluminescent devices processed by hybrid ink-jet printing, Journal of Material Science: Material in Electronics, vol. 11, (2000), pp. 89-96.

* cited by examiner

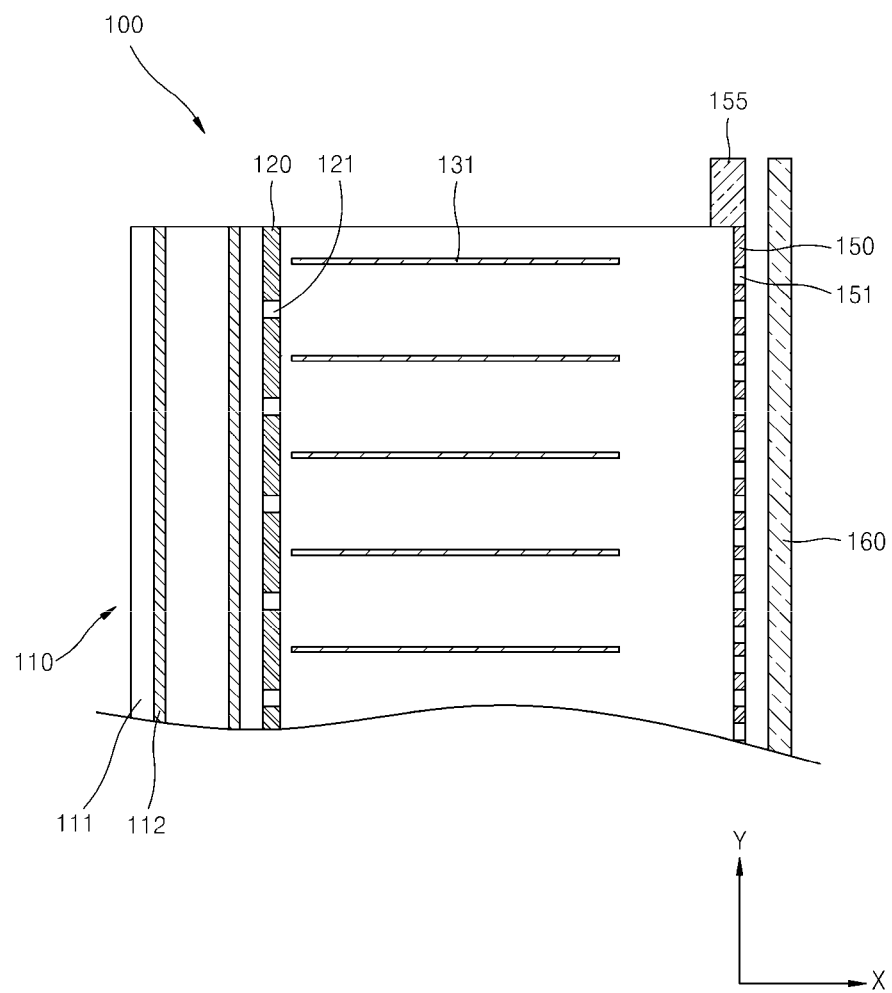

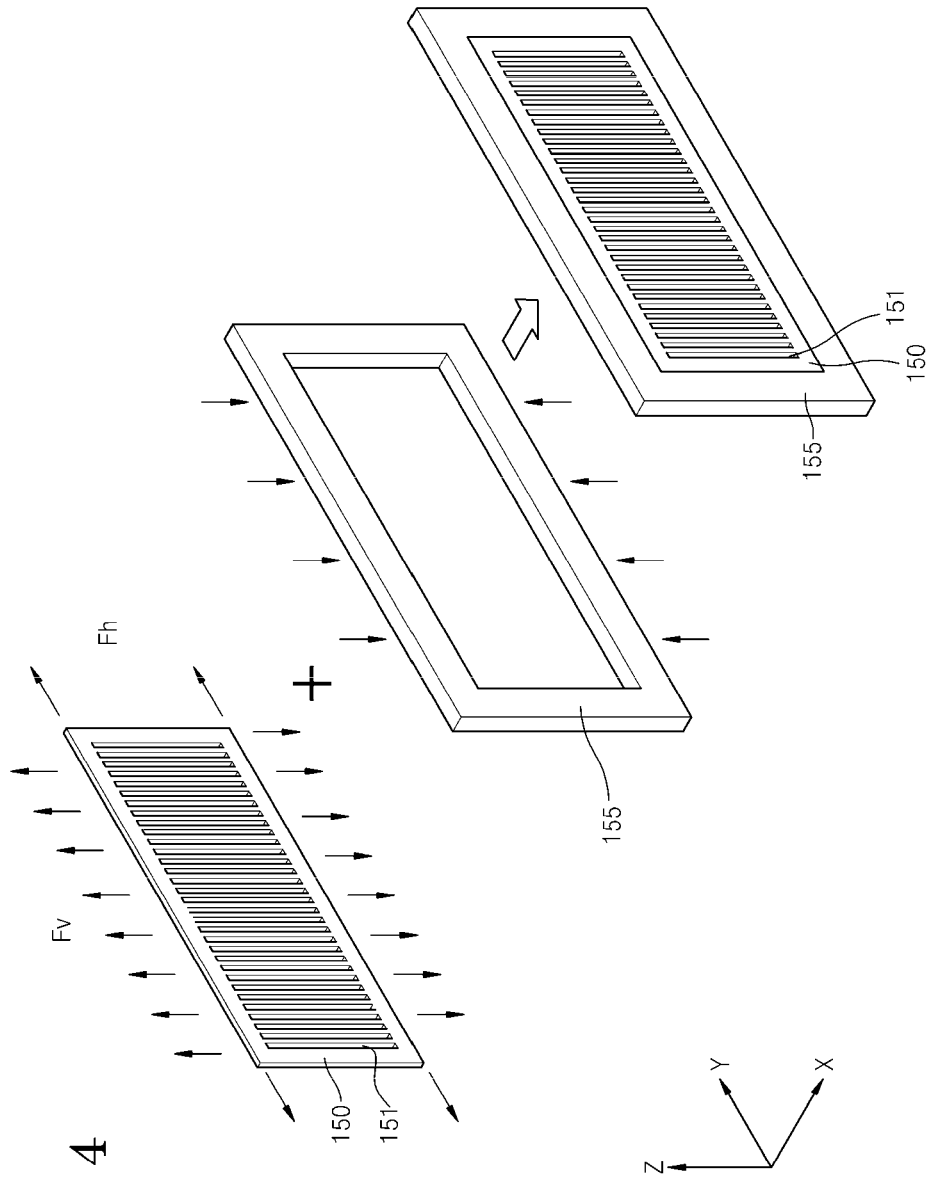

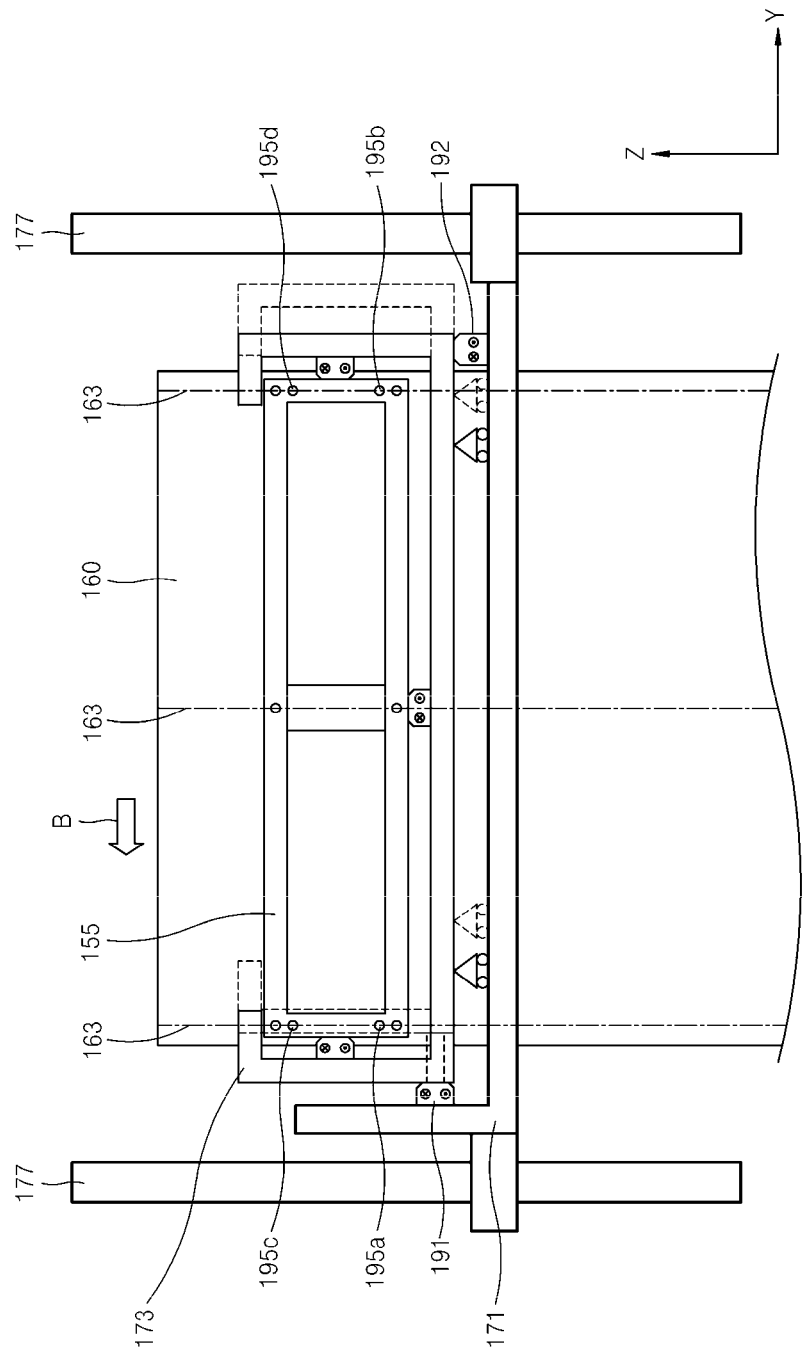

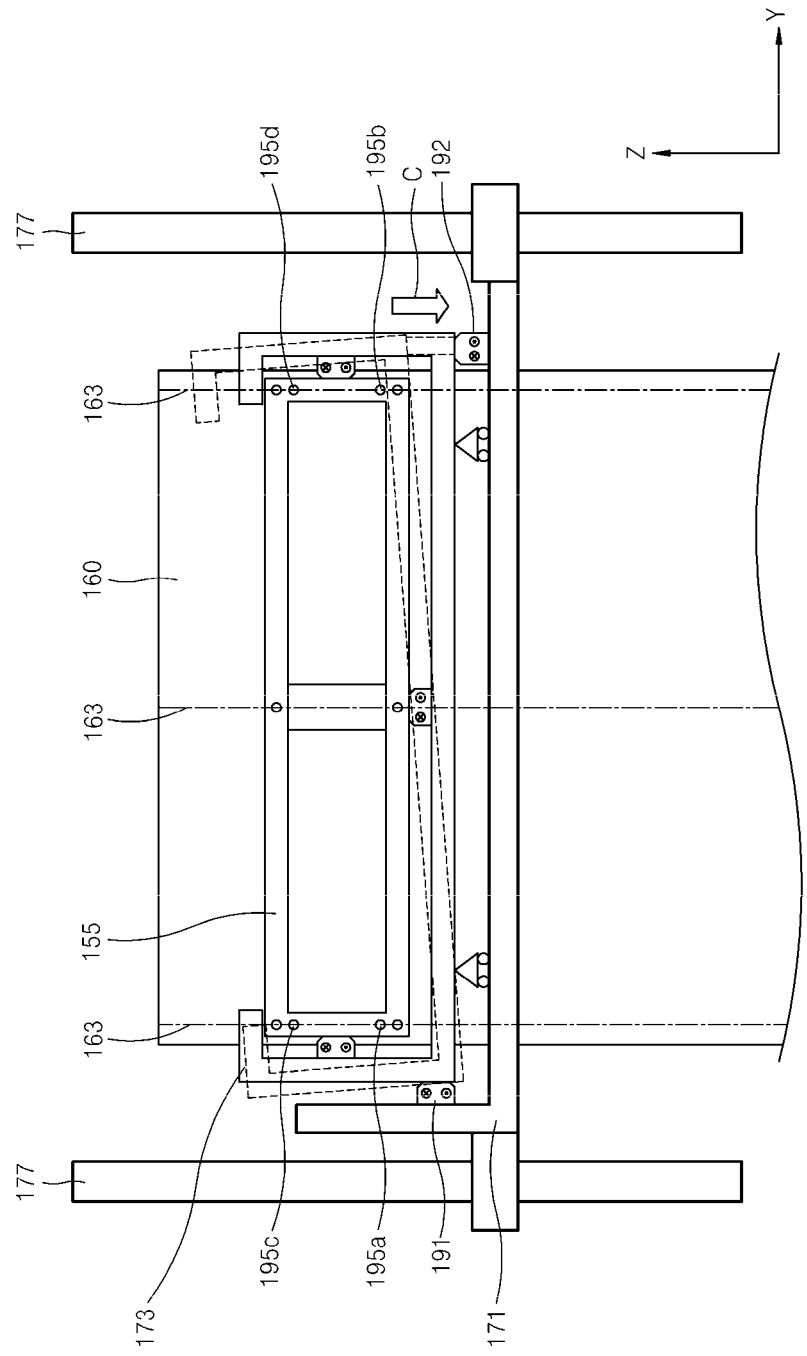

THIN FILM DEPOSITION APPARATUS AND METHOD OF DEPOSITING THIN FILM

CROSS-REFERENCE TO RELATED APPLICATIONS

This application claims the benefit of Korean Patent Application No. 10-2009-0045199, filed May 22, 2009 in the Korean Intellectual Property Office, Korean Patent Application No. 10-2009-0074001, filed Aug. 11, 2009 in the Korean Intellectual Property Office, and Korean Patent Application No. 10-2010-0014272, filed Feb. 17, 2010 in the Korean Intellectual Property Office, the disclosures of which are incorporated herein by reference.

BACKGROUND

1. Field

Aspects of the present invention relate to a thin film deposition apparatus, and more particularly to a thin film deposition apparatus that can be simply applied to produce large-sized display devices on a mass scale and that improves manufacturing yield.

2. Description of the Related Art

Organic light-emitting display devices have a larger viewing angle, better contrast characteristics, and a faster response rate than other display devices. Thus, organic light emitting devices have drawn attention as a next-generation display device.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer and thus light is emitted. However, it is difficult to achieve high light-emission efficiency with such a structure. Thus, intermediate layers (including an electron injection layer, an electron transport layer, a hole transport layer, a hole injection layer, or the like) are optionally additionally interposed between the emission layer and each of the electrodes.

Also, it is practically very difficult to form fine patterns in organic thin films (such as the emission layer and the intermediate layers). Red, green, and blue light-emission efficiency varies according to the organic thin films. For these reasons, it is not easy to form an organic thin film pattern on a large substrate, such as a mother glass having a size of 5G or more, by using a conventional thin film deposition apparatus. Thus, it is difficult to manufacture large organic light-emitting display devices having satisfactory driving voltage, current density, brightness, color purity, light-emission efficiency, life-span characteristics. Therefore, there is a demand for improvement in this regard.

An organic light-emitting display device includes intermediate layers (including an emission layer) disposed between a first electrode and a second electrode that are arranged opposite to each other. The electrodes and the intermediate layers may be formed via various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

SUMMARY

Aspects of the present invention provides a thin film deposition apparatus that may be easily manufactured, that may be simply applied to manufacture large-sized display devices on a mass scale, that improves manufacturing yield and deposition efficiency, and that has a structure that allows an interval between a nozzle and a substrate to be easily adjusted.

According to an aspect of the present invention, there is provided a thin film deposition apparatus for forming a thin film on a substrate, the apparatus including: a deposition source; a first nozzle disposed at a side of the deposition source and including a plurality of first slits arranged in a first direction; a second nozzle disposed opposite to the first nozzle and including a plurality of second slits arranged in the first direction; a barrier wall assembly including a plurality of barrier walls that are arranged in the first direction in order to partition a space between the first nozzle and the second nozzle; and at least one of an interval control member that adjusts an interval between the second nozzle and the substrate, and an alignment control member that adjusts alignment between the second nozzle and the substrate.

According to an aspect of the invention, the interval control member may adjust the interval between the second nozzle and the substrate to be constant.

According to an aspect of the invention, the interval control member may include a sensor that senses a position of the second nozzle relative to the substrate, and an actuator that provides a driving force for moving the second nozzle relative to the substrate.

According to an aspect of the invention, the substrate may include a positioning mark, and the sensor may sense the position of the second nozzle relative to the substrate based on the positioning mark. In this regard, an open mask may be arranged on the substrate not to overlap with the positioning mask.

According to an aspect of the invention, the thin film deposition apparatus may further include: a base frame; and a tray that is arranged on the base frame and accommodates the second nozzle therein.

According to an aspect of the invention, the actuator may adjust the interval between the second nozzle and the substrate by moving the second nozzle relative to the tray.

According to an aspect of the invention, the interval control member may include: a first actuator that is disposed between a side of the second nozzle and the tray to move the second nozzle relative to the tray; a second actuator that is disposed between a side of the second nozzle opposite to the side of the second nozzle on which the first actuator is disposed and the tray to move the second nozzle relative to the tray; and a third actuator that rotates the second nozzle with respect to an axis parallel to the first direction.

According to an aspect of the invention, the actuator may include a piezoelectric motor.

According to an aspect of the invention, the actuator and the sensor may adjust the interval between the second nozzle and the substrate by real-time feedback control.

According to an aspect of the invention, the interval control member may include rollers or balls that are disposed at opposite end portions of the second nozzle and contact the substrate.

According to an aspect of the invention, the alignment control member may adjust a position of the second nozzle relative to the substrate to be constant.

According to an aspect of the invention, the alignment control member may include: a sensor that senses a position of the second nozzle relative to the substrate; and an actuator that provides a driving force for moving the second nozzle relative to the substrate.

According to an aspect of the invention, the substrate may include a positioning mark, and the sensor may sense the position of the second nozzle relative to the substrate based on the positioning mark. In this regard, an open mask may be arranged on the substrate not to overlap with the positioning mask.

According to an aspect of the invention, the thin film deposition apparatus may further include: a base frame; and a tray that is arranged on the base frame and accommodates the second nozzle therein.

According to an aspect of the invention, the actuator may adjust the alignment between the second nozzle and the substrate by moving the second nozzle relative to the tray.

According to an aspect of the invention, the alignment control member may include: a first actuator that is disposed between a side of the tray and the base frame to linearly move the tray relative to the base frame; and a second actuator that is disposed between a side of the tray opposite to the first actuator and the base frame to rotatably move the tray relative to the base frame.

According to an aspect of the invention, the actuator may include a piezoelectric motor.

According to an aspect of the invention, the actuator and the sensor may adjust the alignment between the second nozzle and the substrate by real-time feedback control.

According to an aspect of the invention, each of the barrier walls may extend in a second direction that is substantially perpendicular to the first direction, in order to partition the space between the first nozzle and the second nozzle.

According to an aspect of the invention, the plurality of barrier walls may be arranged at equal intervals.

According to an aspect of the invention, the barrier walls may be separated from the second nozzle by a predetermined distance.

According to an aspect of the invention, the barrier wall assembly may be detachable from the thin film deposition apparatus.

According to an aspect of the invention, the barrier wall assembly may include a first barrier wall assembly including a plurality of first barrier walls, and a second barrier wall assembly including a plurality of second barrier walls.

According to an aspect of the invention, each of the first barrier walls and each of the second barrier walls may extend in a second direction that is substantially perpendicular to the first direction, in order to partition the space between the first nozzle and the second nozzle.

According to an aspect of the invention, the first barrier walls may be arranged to correspond to the second barrier walls.

According to an aspect of the invention, each pair of the corresponding first and second barrier walls may be arranged on substantially the same plane.

According to an aspect of the invention, a deposition material vaporized in the deposition source may be deposited on the substrate by being discharged through the first nozzle and the second nozzle.

According to an aspect of the invention, the second nozzle may be separated from the substrate by a predetermined distance.

According to an aspect of the invention, the deposition source, the first nozzle, the second nozzle, and the barrier wall assembly may be movable relative to the substrate, or the substrate may be movable relative to the deposition source, the first nozzle, the second nozzle, and the barrier wall assembly.

According to an aspect of the invention, the deposition material may be deposited on the substrate while the deposition source, the first nozzle, the second nozzle, and the barrier wall assembly are moved relative to the substrate or while the substrate is moved relative to the deposition source, the first nozzle, the second nozzle, and the barrier wall assembly.

According to an aspect of the invention, the deposition source, the first nozzle, the second nozzle, and the barrier wall assembly may be moved relative to the substrate along a plane parallel to a surface of the substrate, or the substrate may be moved relative to the deposition source, the first nozzle, the second nozzle, and the barrier wall assembly along the plane.

According to an aspect of the present invention, there is provided a thin film deposition apparatus for forming a thin film on a substrate, the apparatus including: a deposition source that discharges a deposition material; a first nozzle disposed at a side of the deposition source and including a plurality of first slits arranged in a first direction; a second nozzle disposed opposite to the first nozzle and including a plurality of second slits arranged in a second direction perpendicular to the first direction; and at least one of an interval control member that adjusts an interval between the second nozzle and the substrate, and an alignment control member that adjusts alignment between the second nozzle and the substrate, wherein a deposition is performed while the substrate or the thin film deposition apparatus moves relative to each other in the first direction, and the deposition source, the first nozzle and the second nozzle are integrally formed as one body.

According to an aspect of the invention, the interval control member may adjust the interval between the second nozzle and the substrate to be constant.

According to an aspect of the invention, the interval control member may include: a sensor that senses a position of the second nozzle relative to the substrate; and an actuator that provides a driving force for moving the second nozzle relative to the substrate.

According to an aspect of the invention, the substrate may include a positioning mark, and the sensor may sense the position of the second nozzle relative to the substrate based on the positioning mark. In this regard, an open mask may be arranged on the substrate not to overlap with the positioning mask.

According to an aspect of the invention, the thin film deposition apparatus may further include: a base frame; and a tray that is arranged on the base frame and accommodates the second nozzle therein.

According to an aspect of the invention, the actuator may adjust the interval between the second nozzle and the substrate by moving the second nozzle relative to the tray.

According to an aspect of the invention, the interval control member may include: a first actuator that is disposed between a side of the second nozzle and the tray to move the second nozzle relative to the tray; a second actuator that is disposed between a side of the second nozzle opposite to the side of the second nozzle on which the first actuator is disposed and the tray to move the second nozzle relative to the tray; and a third actuator that rotates the second nozzle with respect to an axis parallel to the first direction.

According to an aspect of the invention, the actuator may include a piezoelectric motor.

According to an aspect of the invention, the actuator and the sensor may adjust the interval between the second nozzle and the substrate by real-time feedback control.

According to an aspect of the invention, the interval control member may include rollers or balls that are disposed at opposite end portions of the second nozzle and contact the substrate.

According to an aspect of the invention, the alignment control member may adjust a position of the second nozzle relative to the substrate to be constant.

According to an aspect of the invention, the alignment control member may include: a sensor that senses a position of the second nozzle relative to the substrate; and an actuator that provides a driving force for moving the second nozzle relative to the substrate.

According to an aspect of the invention, the substrate may further include a positioning mark, and the sensor senses the position of the second nozzle relative to the substrate based on the positioning mark. In this regard, an open mask may be arranged on the substrate not to overlap with the positioning mask.

According to an aspect of the invention, the thin film deposition apparatus may further include: a base frame; and a tray that is arranged on the base frame and accommodates the second nozzle therein.

According to an aspect of the invention, the actuator may adjust the alignment between the second nozzle and the substrate by moving the second nozzle relative to the tray.

According to an aspect of the invention, the alignment control member may include: a first actuator that is disposed between a side of the tray and the base frame to linearly move the tray relative to the base frame; and a second actuator that is disposed between a side of the tray opposite to the first actuator and the base frame to rotatably move the tray relative to the base frame.

According to an aspect of the invention, the actuator may include a piezoelectric motor.

According to an aspect of the invention, the actuator and the sensor may adjust the alignment between the second nozzle and the substrate by real-time feedback control.

According to an aspect of the invention, the deposition source, the first nozzle and the second nozzle may be integrally connected as one body by a connection member.

According to an aspect of the invention, the connection member may guide flow of the deposition material.

According to an aspect of the invention, the connection member may seal a space between the deposition source and the first nozzle, and the second nozzle.

According to an aspect of the invention, the thin film deposition apparatus may be separated from the substrate by a predetermined distance.

According to an aspect of the invention, the deposition material discharged from the thin film deposition apparatus may be continuously deposited on the substrate while the substrate or the thin film deposition apparatus may be moved relative to each other in the first direction.

According to an aspect of the invention, the second nozzle may be smaller than the substrate.

According to an aspect of the invention, the plurality of first slits may be tilted by a predetermined angle.

According to an aspect of the invention, the plurality of first slits may include first slits that are arranged in two rows along the first direction to tilt towards each other.

According to an aspect of the invention, the plurality of first slits may include first slits that are arranged in two rows along the first direction, wherein the first slits of a first row, which is one of the two rows, are arranged to face an end portion of the second nozzle opposite to a second row of the first slits, and the first slits of the second row are arranged to face an end portion of the second nozzle opposite to the first row of the first slits.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 3 is a schematic plan view of the thin film deposition apparatus of FIG. 1, according to an embodiment of the present invention.

FIG. 4 is a schematic perspective view illustrating a binding structure of a second nozzle and a second nozzle frame, according to an embodiment of the present invention.

FIGS. 9A and 9B are front views for describing a method of adjusting alignment between the second nozzle and the substrate in the thin film deposition apparatus of FIG. 7 by using the adjustment control member, according to an embodiment of the present invention.

DETAILED DESCRIPTION

Figure 1:
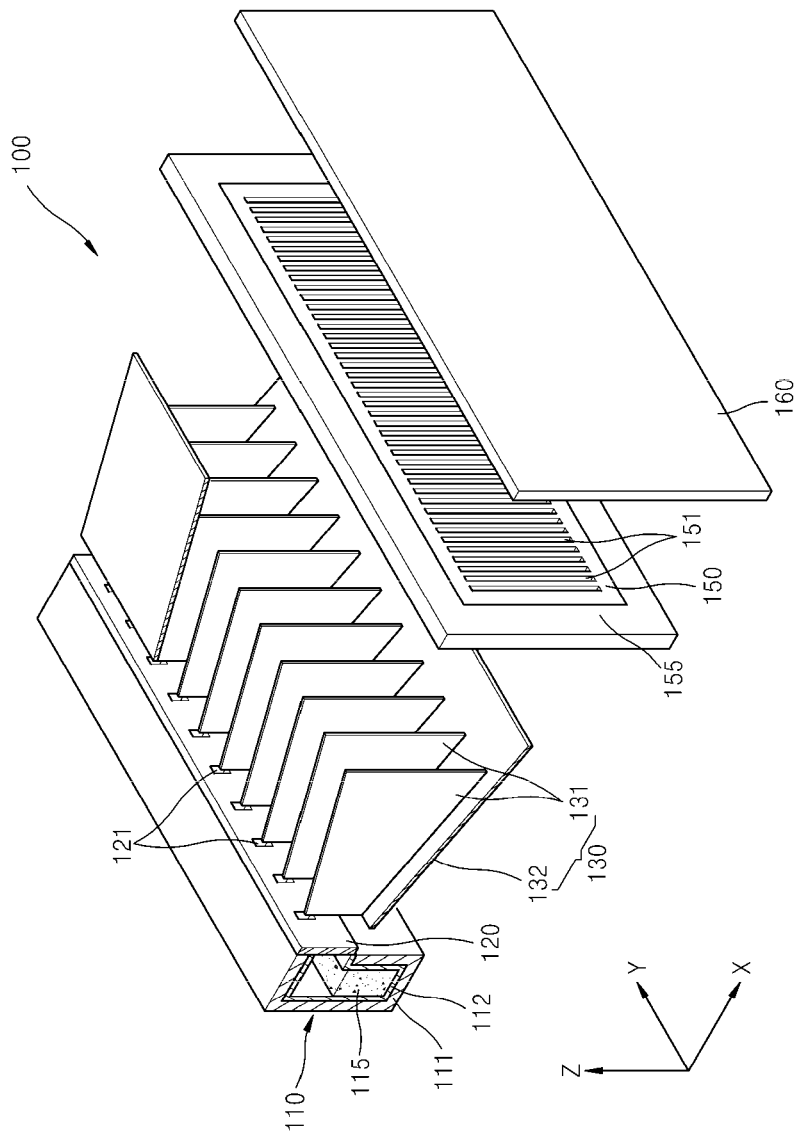
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
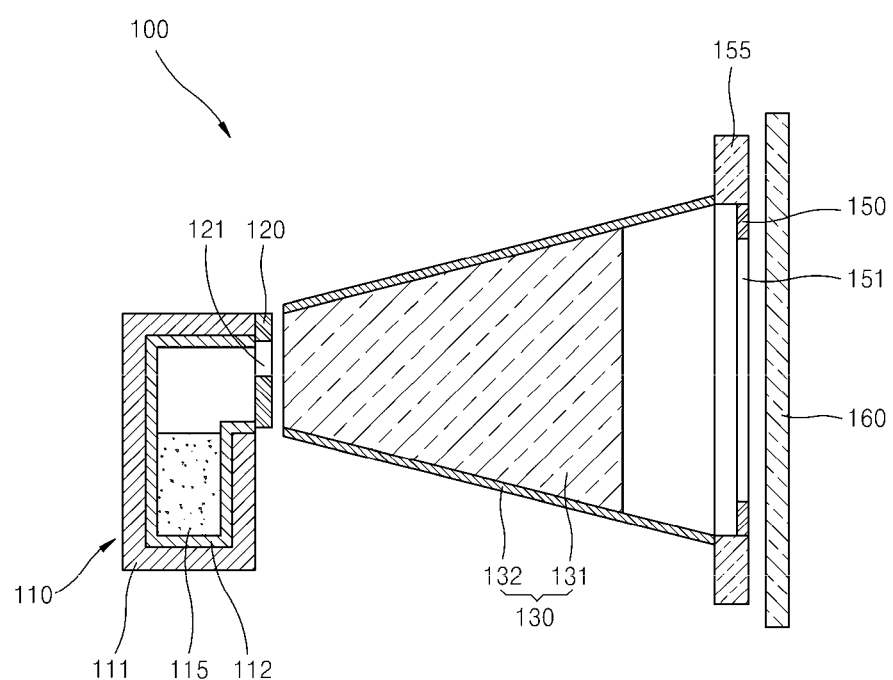
FIG. 2 is a schematic side view of the thin film deposition apparatus of FIG. 1, according to an embodiment of the present invention.

FIG. 1 is a schematic perspective view of a thin film deposition apparatus 100 according to an embodiment of the present invention, FIG. 2 is a schematic side view of the thin film deposition apparatus 100, and FIG. 3 is a schematic plan view of the thin film deposition apparatus 100. Referring to FIGS. 1, 2 and 3, the thin film deposition apparatus 100 includes a deposition source 110, a first nozzle 120, a barrier wall assembly 130, a second nozzle 150, a second nozzle frame 155, and a substrate 160. The thin film deposition apparatus 100 further includes an interval control member (not shown) and an alignment control member (not shown). The interval control member and the alignment control member will be described later in detail with reference to FIGS. 7 to 12B.

Although a chamber is not illustrated in FIGS. 1, 2 and 3 for convenience of explanation, all the components of the thin film deposition apparatus 100 may be disposed within a chamber that is maintained at an appropriate degree of vacuum. The chamber is maintained at an appropriate vacuum in order to allow a deposition material to move in a substantially straight line through the thin film deposition apparatus 100.

The deposition material 115 is emitted from the deposition source 110 and is discharged through the first nozzle 120 and the second nozzle 150. The discharged deposition material 115 is deposited on the substrate 160 in a desired pattern, the chamber should be maintained in a high-vacuum state as in a deposition method using a fine metal mask (FMM). In addition, the temperatures of the barrier wall assembly 130 and the second nozzle 150 should be sufficiently lower than the temperature of the deposition source 110 to maintain a space between the second nozzle 120 and the second nozzle 150 in a high-vacuum state. In this regard, the temperatures of the barrier wall assembly 130 and the second nozzle 150 may be about 100° C. or less. This is because the deposition material 115 that has collided against the first barrier wall assembly 130 may not be vaporized again when the temperatures of the first barrier wall assembly 130 and the second nozzle 150 are sufficiently low. In addition, thermal expansion of the second nozzle 150 may be minimized when the temperature of the second nozzle 150 is sufficiently low. The barrier wall assembly 130 faces the deposition source 110 which is at a high temperature. In addition, the temperature of a portion of the first barrier wall assembly 130 close to the deposition source 110 rises by a maximum of about 167° C., and thus a partial-cooling apparatus may be further included if needed. To this end, the barrier wall assembly 130 may include a cooling member.

The substrate 160 constitutes a deposition target on which the deposition material 115 is to be deposited. The substrate 160 is disposed in the chamber. The substrate 160 may be a substrate for flat panel displays. A large substrate, such as a mother glass, for manufacturing a plurality of flat panel displays, may be used as the substrate 160. While not required, the mother glass can have a size of 5G or more. Other substrates may also be employed.

The deposition source 110 contains and heats the deposition material 115. The deposition source 110 is disposed on a side of the chamber which is opposite to the side on which the substrate 160 is disposed. As the deposition material 115 contained in the deposition source 110 is vaporized, the deposition material 115 is deposited on the substrate 160. The deposition source 110 includes a crucible 111 and a heater 115. The crucible 111 holds the deposition material 115. The heater 112 heats the crucible 111 to vaporize the deposition material 115 contained in the crucible 111 towards a side of the crucible 111, and in particular, towards the first nozzle 120.

The first nozzle 120 is disposed at a side of the deposition source 110 facing the substrate 160. The first nozzle 120 includes a plurality of first slits 121 arranged at equal intervals in a Y-axis direction, with each first slit 121 being elongated in the Z-axis direction. The deposition material 115 that is vaporized in the deposition source 110 passes through the first nozzle 120 towards the substrate 160.

The barrier wall assembly 130 is disposed at a side of the first nozzle 120. The barrier wall assembly 130 includes a plurality of barrier walls 131, and a barrier wall frame 132 that covers sides of the barrier walls 131. While not required in all aspects, the plurality of barrier walls 131 may be arranged parallel to each other at equal intervals in the Y-axis direction as shown. In addition, each of the barrier walls 131 may be arranged parallel to an XZ plane as in FIG. 1 (i.e., perpendicular to the Y-axis direction). The plurality of barrier walls 131 arranged as described above partition the space between the first nozzle 120 and the second nozzle 150, which is to be described later. In the thin film deposition apparatus 100 according to the shown embodiment of the present invention, the deposition space is divided by the barrier walls 131 into sub-deposition spaces that respectively correspond to the first slits 121 through which the deposition material 115 is discharged.

The barrier walls 131 are shown respectively disposed between adjacent first slits 121. In other words, each of the first slits 121 may be disposed between two corresponding adjacent barrier walls 131. The first slits 121 may be respectively located at the midpoint between two adjacent barrier walls 131. As described above, since the barrier walls 131 partition the space between the first nozzle 120 and the second nozzle 150, the deposition material 115 discharged through each of the first slits 121 is not mixed with the deposition material 115 discharged through the other first slits 121, and passes through second slits 151 so as to be deposited on the substrate 160. In other words, the barrier walls 131 guide the deposition material 115, which is discharged through the first slits 121, not to flow in the Y-axis direction.

The barrier wall frame 132, which covers upper and lower sides of the barrier walls 131, retain the positions of the barrier walls 131, and guides the deposition material 115, which is discharged through the first slits 121, not to flow in a Z-axis direction.

In addition, the barrier wall assembly 130 may be constructed to be detachable from the thin film deposition apparatus 100. A conventional FMM deposition method has a low deposition efficiency. "Deposition efficiency" refers to the ratio of a deposition material deposited on a substrate to the deposition material vaporized from a deposition source. The conventional FMM deposition method has a deposition efficiency of about 32%. Furthermore, in the conventional FMM deposition method, about 68% of the organic deposition material that is not deposited on the substrate remains adhered to the deposition apparatus, and thus reusing the deposition material is not straightforward.

In order to overcome these problems, in the thin film deposition apparatus 100 according to the shown embodiment of the present invention, the deposition space is enclosed by using the barrier wall assembly 130. The deposition material 115 that remains undeposited is mostly deposited within the barrier wall assembly 130. Thus, when a large amount of the deposition material 115 lies in the barrier wall assembly 130 after a long deposition process, the barrier wall assembly 130 may be detached from the thin film deposition apparatus 100 and then placed in a separate deposition material recycling apparatus to recover the deposition material 115. Due to the structure of the thin film deposition apparatus 100, a reuse rate of the deposition material 115 is increased, so that the deposition efficiency is improved, whereas the manufacturing costs are reduced. However, it is understood that the barrier wall assembly 130 is not required in all aspects.

The second nozzle 150 and the second nozzle frame 155 are disposed between the deposition source 110 and the substrate 160. The second nozzle frame 155 may be formed in a lattice shape, similar to a window frame. The second nozzle 150 is bound inside the second nozzle frame 155. Although the second nozzle 150 and the second nozzle frame 155 are illustrated as separate members that are bound together, the present invention is not limited thereto. For example, the second nozzle 150 and the second nozzle frame 155 may be integrally formed as one body. In this case, the second nozzle 150 and the second nozzle frame 155 may be collectively referred to as a second nozzle.

The second nozzle 150 includes a plurality of second slits 151 arranged at equal intervals in the Y-axis direction, with each second slit 151 being elongated in the Z-axis direction. The deposition material 115 that is vaporized in the deposition source 110 passes through the first nozzle 120 and the second nozzle 150 towards the substrate 160.

In the thin film deposition apparatus 100, the total number of second slits 151 may be greater than the total number of first slits 121. In addition, there may be a greater number of second slits 151 than first slits 121 disposed between two adjacent barrier walls 131. In other words, at least one first slit 121 may be disposed between each two adjacent barrier walls 131. Meanwhile, a plurality of second slits 151 may be disposed between each two adjacent barrier walls 131. The space between the first nozzle 120 and the second nozzle 150 is partitioned by the barrier walls 131 into sub-deposition spaces that correspond to the first slits 121, respectively. Thus, the deposition material 115 discharged from each of the first slits 121 passes through a plurality of second slits 151 disposed in the sub-deposition space corresponding to the first slit 121, and is then deposited on the substrate 160.

The second nozzle 150 may be manufactured by etching, which is the same method as used in a conventional method of manufacturing an FMM, and in particular, a striped FMM. In the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In the thin film deposition apparatus 100, a thin film is deposited while the thin film deposition apparatus 100 is moved in the Z-axis direction within the chamber (not shown). In other words, once the thin film deposition apparatus 100 has completed deposition at a current location, the thin film deposition apparatus 100 and/or the substrate 160 are moved relative to each other in the Z-axis direction for further continuous deposition. Thus, in the thin film deposition apparatus 100, the second nozzle 150 may be significantly smaller than a FMM used in a conventional deposition method. In the thin film deposition apparatus 100, the length of the second nozzle 150 in the Z-axis direction may be less than the length of the substrate 160 in the Z-axis direction, provided that the width of the second nozzle 150 in the Y-axis direction is equal to the width of the substrate 160 in the Y-axis direction. As described above, since the second nozzle 150 may be formed to be significantly smaller than a FMM used in a conventional deposition method, it is relatively easy to manufacture the second nozzle 150. The use of the second nozzle 150, which is smaller than a FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

The barrier wall assembly 130 and the second nozzle 150 are separated from each other by a predetermined distance. The barrier wall assembly 130 and the second nozzle 150 are separated from each other for one or more of the following reasons.

The second nozzle 150 and the second nozzle frame 155 have to be aligned with the substrate 160 to be accurate in position and to have a constant interval therebetween, and thus require high-precision control. In order to make it easy to control such parts that require high-precision control, the second nozzle 150 and the second nozzle frame 155 are separated from the deposition source 110, the first nozzle 120 and the barrier wall assembly 130, which are relatively heavy parts not requiring precise control.

The temperature of the barrier wall assembly 130 may increase to 100° C. or higher due to the deposition source 110, which has a high temperature. Thus, in order to prevent the heat of the barrier wall assembly 130 from being conducted to the second nozzle 150, the barrier wall assembly 130 and the second nozzle 150 are separated from each other. In the thin film deposition apparatus 100 according to the shown embodiment of the present invention, the deposition material 115 adhered to the barrier wall assembly 130 is mostly reused, whereas the deposition material 115 adhered to the second nozzle 150 may not be reused. Thus, when the barrier wall assembly 130 is separated from the second nozzle 150, it may be straightforward to recover the deposition material 115 to be reused. In addition, a calibration plate (not shown) may be further installed in order to ensure uniformity of a thin film over the entire substrate 160. When the barrier walls 131 are separated from the second nozzle 150, it is very straightforward to install the calibration plate. Finally, a partition (not shown) may be further installed in order to prevent deposition of the deposition material 115 on the second nozzle 150 after deposition onto the substrate 160 has been completed and before another target is subjected to deposition. This may extend a nozzle exchange cycle. It is straightforward to install the partition between the barrier walls 131 and the second nozzle 150.

FIG. 4 is a schematic perspective view illustrating a binding structure of the second nozzle 150 and the second nozzle frame 155, according to an embodiment of the present invention. Referring to FIG. 4, the shown second nozzle frame 155 is formed in a lattice shape, similar to a window frame. The second nozzle 150 includes the plurality of second slits 151 and is bound inside the second nozzle frame 155. In the thin film deposition apparatus 100, the second nozzle 150 is bound to the second nozzle frame 155 such that a tensile force is exerted on the second nozzle 150 by the second nozzle frame 155.

In particular, a degree of pattern precision of the second nozzle 150 may be affected by a manufacturing error and a thermal expansion error of the second nozzle 150. In order to minimize manufacturing errors of the second nozzle 150, a counter force technique can be used. The counter force technique is used to precisely extend a FMM and weld the FMM to a frame. This will now be described in detail below.

Initially, as illustrated in FIG. 4, an external tensile force is applied to the second nozzle 150 so that the second nozzle 150 is stretched outwards. Next, a compression force is applied to the second nozzle frame 155 in an opposite direction to the direction in which the external tensile force is applied to the second nozzle 150, such that the compression force is in equilibrium with the external tensile force applied to the second nozzle 150. Then, the second nozzle 150 is bound to the second nozzle frame 155 by, for example, welding edges of the second nozzle 150 to the second nozzle frame 155. Finally, the second nozzle 150 and the second nozzle frame 155 are relieved from all the external forces applied thereto to reach equilibrium, so that only a tensile force is exerted on the second nozzle 150 by the second nozzle frame 155. When such precise extension, compression, and welding techniques as described above are used, the second nozzle 150 may be manufactured with a manufacturing error of 2 μm or less. However, it is understood that other techniques can be used to minimize manufacturing errors in addition to or instead of the exemplary counter force technique.

In the thin film deposition apparatus 100, the temperature of the second nozzle frame 150 may be maintained constant. In particular, the second nozzle 150, which is disposed to face the high-temperature deposition source 110, is always exposed to radiant heat from the deposition source 110. Thus, the temperature of the second nozzle 150 is increased to some extent. For example, the second nozzle 150 temperature can be increased by about 5 to about 15° C. However, when the temperature of the second nozzle 150 is increased, the second nozzle 150 may expand, thus deteriorating a degree of pattern precision of the second nozzle 150. In order to overcome this problem, according to an aspect of the present invention, the type of shown second nozzle 150 is a stripe type nozzle. The temperature of the second nozzle frame 155, which supports the second nozzle 150 such that a tensile force is exerted on the second nozzle 150, is maintained constant, thereby preventing pattern errors due to a temperature increase of the second nozzle 150.

The thermal expansion (pattern error) of the second nozzle 150 in a horizontal direction (Y-axis direction) is affected by the temperature of the second frame nozzle 155. Thus, if the temperature of the second nozzle frame 155 is maintained constant, such an error in the pattern of the second nozzle 150 caused due to the thermal expansion does not occur even when the temperature of the second nozzle 150 rises. In addition, the second nozzle 150 thermally expands in a vertical direction (Z-axis direction). However, the vertical direction of the second nozzle 150 is a scanning direction that is irrelevant to the degree of pattern precision of the second nozzle 150.

The second nozzle frame 155 does not directly face the deposition source 110 in a vacuum condition, and thus is not exposed to the radiant heat from the deposition source 110. In addition, since the second nozzle frame 155 is not connected to the deposition source 110, there is no thermal conduction between the deposition source 110 and the second nozzle frame 155. Thus, the temperature of the second nozzle frame 155 is unlikely to rise. Even if the temperature of the second nozzle frame 155 rises slightly (for example, by 1 to 3° C.), the temperature of the second nozzle frame 155 may be easily maintained constant via a thermal shield or a radiation fin.

As described above, when the second nozzle frame 155 exerts a tensile force on the second nozzle 150 and the temperature of the second nozzle frame 155 is maintained constant, the thermal extension problem with the second nozzle 150 no longer affects a problem of pattern precision of the second nozzle 150. Thus, the degree of pattern precision of the second nozzle 150 may be further improved. When precise extension, compression, and welding techniques are used as described above, the second nozzle 150 may be manufactured with a manufacturing error of 2 μm or less. In addition, an error in the pattern of the second nozzle 150 caused due to the thermal expansion of the second nozzle 150 may be prevented by supporting the second nozzle 150 such that a tensile force is exerted thereon and by maintaining the temperature of the second nozzle frame 155 to be constant. Thus, the second nozzle 150 may be manufactured with an error of less than 2 μm, which is attributed to a manufacturing error (<2 μm) of the second nozzle 150 and a thermal expansion error (~0 μm) of the second nozzle 150.

Figure 5A:
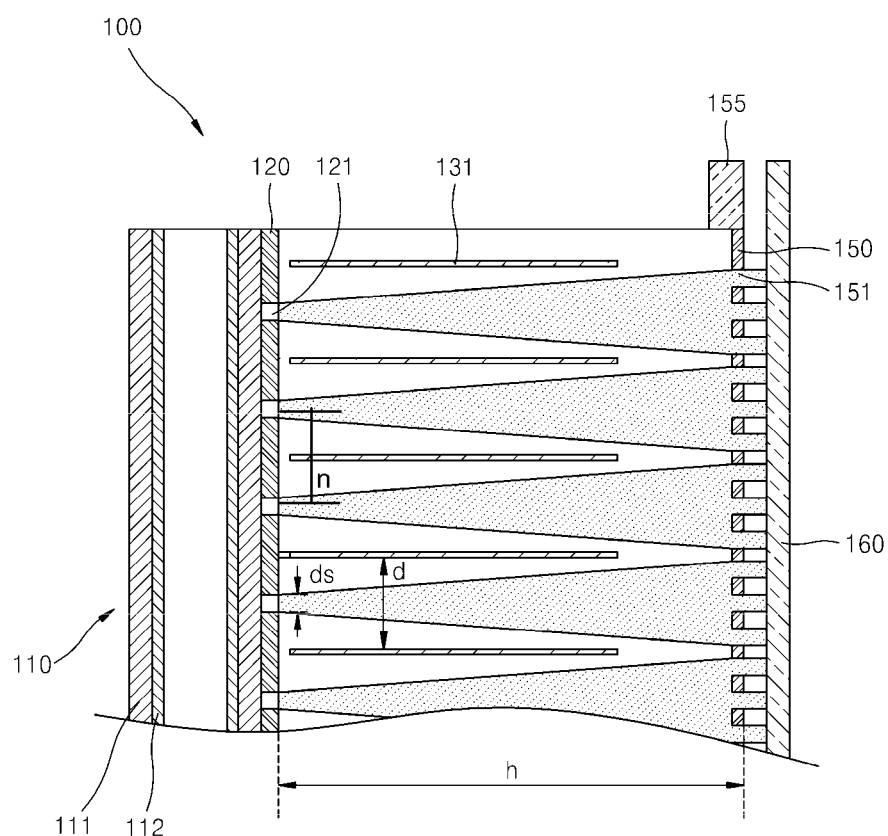
FIG. 5A is a schematic view illustrating deposition of a deposition material in the thin film deposition apparatus of FIG. 1, according to an embodiment of the present invention.
Figure 5B:
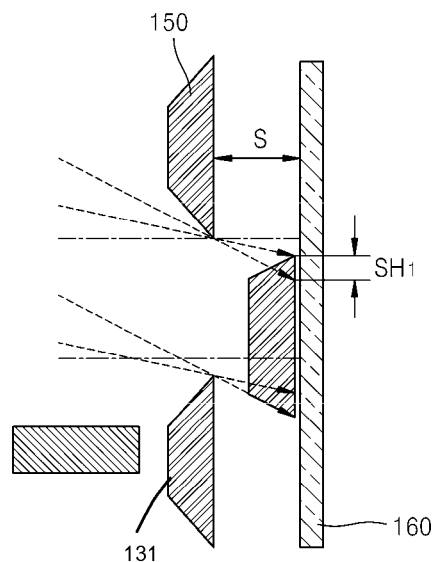
FIG. 5B illustrates a shadow zone of a thin film deposited on a substrate when a deposition space is partitioned by first barrier walls and second barrier walls, as illustrated in FIG. 5A.
Figure 5C:
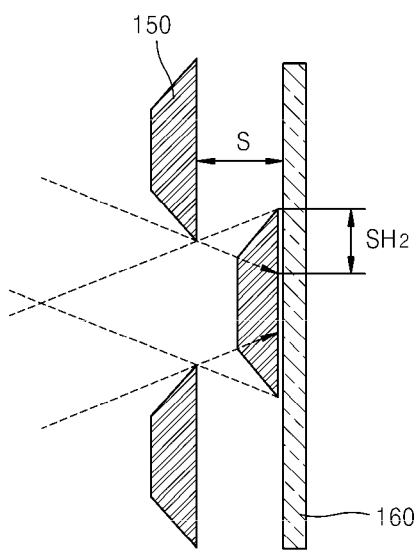
FIG. 5C illustrates a shadow zone of a thin film deposited on the substrate when the deposition space is not partitioned.

FIG. 5A is a schematic view illustrating deposition of the deposition material 115 in the thin film deposition apparatus 100, according to an embodiment of the present invention. FIG. 5B illustrates a shadow zone of a thin film deposited on the substrate 160 when the deposition space is partitioned by the barrier walls 131. FIG. 5C illustrates a shadow zone of a thin film deposited on the substrate 160 when the deposition space is not partitioned.

Referring to FIG. 5A, the deposition material 115 that is vaporized in the deposition source 110. The vaporized deposition material 115 is discharged through the first nozzle 120 and the second nozzle 150, and is then deposited on the substrate 160. Since the space between the first nozzle 120 and the second nozzle 150 is partitioned by the barrier walls 131, the deposition material 115 discharged through each of the first slits 121 of the first nozzle 120 is not mixed with the deposition material 115 discharged through the other adjacent first slits 121 due to the barrier walls 131.

When the space between the first nozzle 120 and the second nozzle 150 is partitioned by the barrier wall assembly 130, the deposition material 115 is deposited on the substrate 160 through the second nozzle 150 at an angle of about 55° to about 90°, as illustrated in FIG. 5B. In other words, the deposition material 115 passing through a second slit 151 away from the middle of each of the sub-deposition spaces is deposited at an angle of about 55°, whereas the deposition material 115 passing through a second slit 151 of the second nozzle 150 in the middle of each of the sub-deposition spaces is deposited at an angle of about 90°. The width $SH_1$ of the shadow zone formed on the substrate 160 is determined according to Equation 1.

$$SH_1 = S * d_s/h \qquad \text{Equation 1}$$

where $d_s$ is the width of the first slits 121, d is an interval between the barrier walls 131, h is a distance between the first nozzle 120 and the second nozzle 150, and S is a distance between the second nozzle 150 and the substrate 160.

However, when the space between the first nozzle 120 and the second nozzle 150 is not partitioned by the barrier walls 131, as illustrated in FIG. 5C, the deposition material 115 is discharged through the second nozzle 150 in a wider range of angles than in the case of FIG. 5B. This is because the deposition material 115 is discharged not just through a first slit 121 directly facing a second slit 151 but also through first slits 121 other than the first slit 121. Thus, a width $SH_2$ of a shadow zone formed on the substrate 160 is much greater than when the deposition space is partitioned by the barrier walls 131. The width $SH_2$ of the shadow zone formed on the substrate 160 is determined according to Equation 2.

$$SH_2 = S*2n/h \qquad \text{Equation 2}$$

Referring to Equations 1 and 2, the width $d_s$ is a few to tens times smaller than the interval n between the adjacent first slits 121. Thus, the shadow zone may have a smaller width when the space between the first nozzle 120 and the second nozzle 150 is partitioned by the barrier walls 131. The width $SH_1$ of the shadow zone formed on the substrate 160 may be reduced by either one of the followings: (1) by reducing the interval ("d") between the adjacent barrier walls 131, (2) by reducing the distance ("S") between the second nozzle 150 and the substrate 160, or (3) by increasing the distance ("h") between the first nozzle 120 and the second nozzle 150.

As described above, the shadow zone formed on the substrate 160 may be reduced by installing the barrier walls 131. Thus, the second nozzle 150 can be separated from the substrate 160. In the thin film deposition apparatus 100 according to the current embodiment of the present invention, the second nozzle 150 may be separated from the substrate 160 by a predetermined distance. In a conventional deposition method using a FMM, deposition is performed with the FMM in close contact with a substrate in order to prevent formation of a shadow zone on the substrate. However, when the FMM is used in close contact with the substrate, the contact may cause defects. In order to overcome this problem, in the thin film deposition apparatus 100, the second nozzle 150 is disposed to be separated from the substrate 160 by a predetermined distance. This may be facilitated by installing the barrier walls 131 to reduce the width of the shadow zone formed on the substrate 160.

As described above, according to aspects of the present invention, a defect caused due to the contact between a substrate and a FMM, which occurs in a conventional deposition method, may be prevented. In addition, since it is unnecessary to dispose the FMM in close contact with the substrate during a deposition process, the manufacturing time may be reduced.

Hereinafter, an interval control member and an alignment control member are used to obtain sufficient alignment precision and interval precision between the second nozzle 150 and the substrate 160 in the thin film deposition apparatus 100 according to an embodiment of the present invention will be described in detail.

As described above, in the thin film deposition apparatus 100 according to the current embodiment of the present invention, the second nozzle 150 is separated from the substrate 160 by a predetermined distance, and deposition is performed while the second nozzle 150 is moved relative to the substrate 160 in the Z-axis direction. However, in order to form a precise thin film pattern while moving the second nozzle 150, positional precision between the second nozzle 150 and the substrate 160 is very significant. In addition, pattern position may be shifted when the interval between the second nozzle 150 and the substrate 160 varies. Thus, the interval between the second nozzle 150 and the substrate 160 has to be maintained as constant as possible. For example, the interval could be maintained at 100 μm. To this end, the thin film deposition apparatus 100 may include an interval control member and an alignment control member. Thus, the interval between the second nozzle 150 and the substrate 160 may be maintained constant, and at the same time the second nozzle 150 and the substrate 160 may be precisely aligned with each other.

Figure 6:
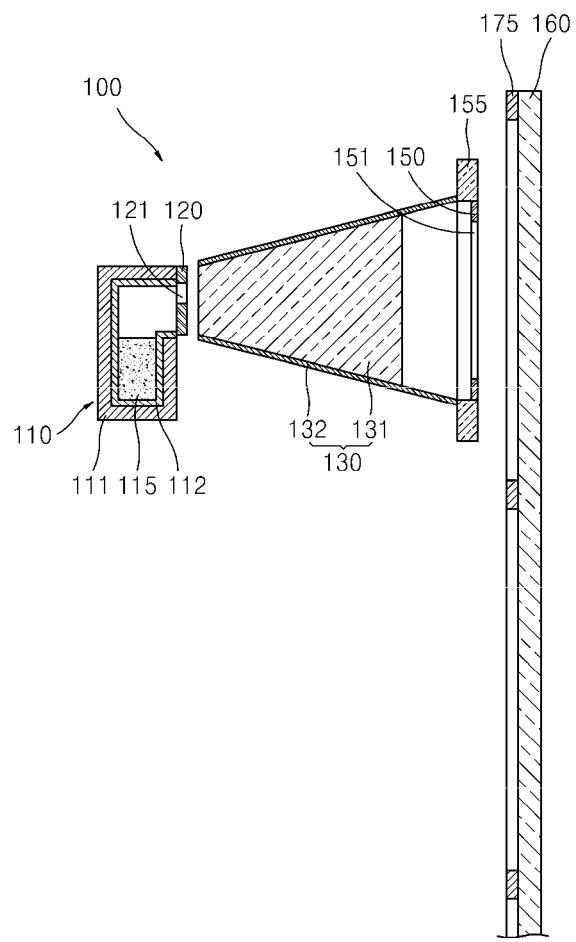
FIG. 6 is a schematic side cross-sectional view of the thin film deposition apparatus of FIG. 1, according to an embodiment of the present invention.
Figure 7:
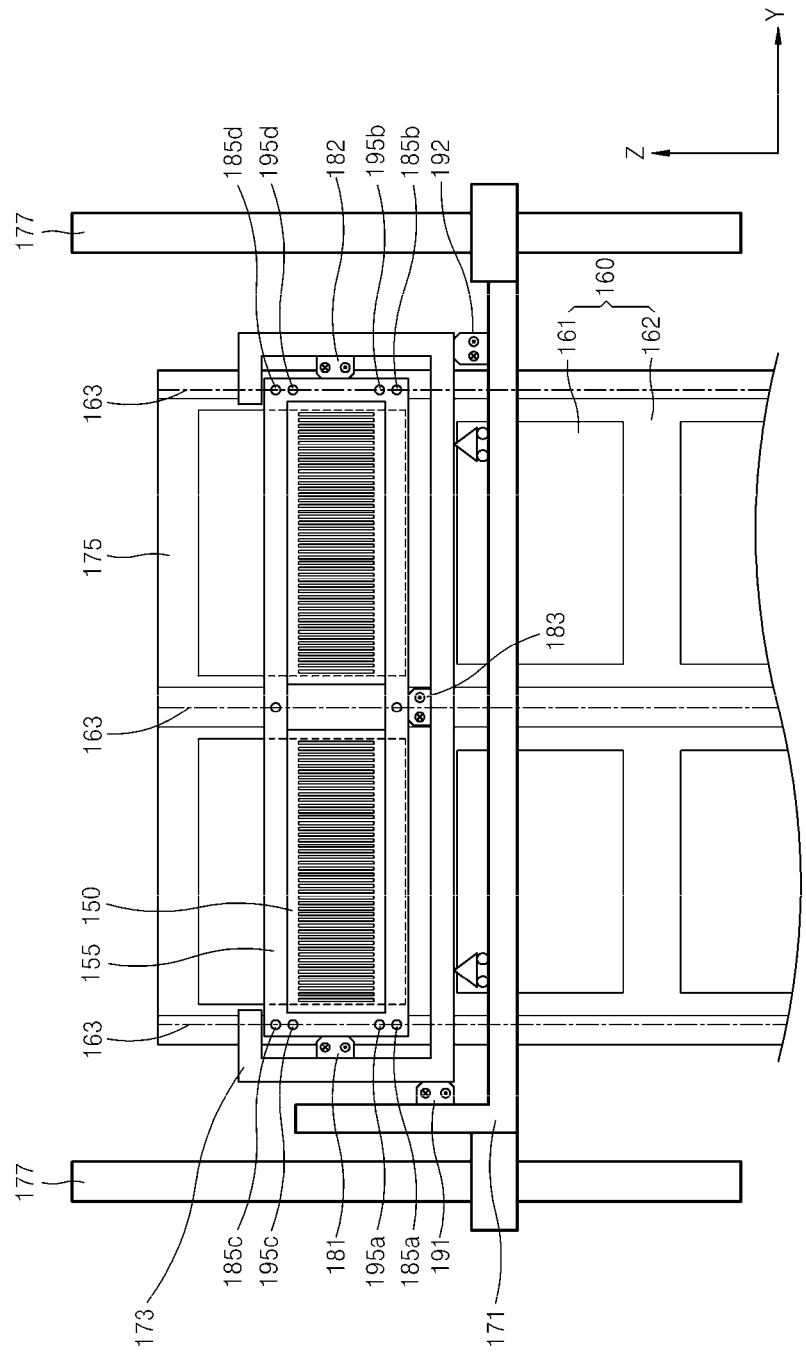
FIG. 7 is a front view of the thin film deposition apparatus of FIG. 6, illustrating an interval control member and an alignment control member according to an embodiment of the present invention.

FIG. 6 is a schematic side cross-sectional view of the thin film deposition apparatus 100 of FIG. 1, according to an embodiment of the present invention. FIG. 7 is a schematic front view of the thin film deposition apparatus 100, illustrating an interval control member and an alignment control member according to an embodiment of the present invention. For convenience of explanation, all the elements of the thin film deposition apparatus 100 of FIG. 6, excluding the second nozzle 150, the second nozzle frame 155 and the substrate 160, are not illustrated in FIG. 7.

Referring to FIGS. 6 and 7, the thin film deposition apparatus 100 includes a base frame 171, a tray 173, an open mask 175, rails 177, the interval control member, and the alignment control member. While not required in all aspects, a control unit (not shown) controls the interval control member, and the alignment control member. According to aspects of the invention, the control unit can be implemented as one or more general or special purpose processors executing software and/or firmware encoded on at least one computer readable medium.

The substrate 160 includes a deposition region 161 in which the deposition material 115 is deposited, and a non-deposition region 162 in which no deposition material is deposited. In addition, the substrate 160 includes positioning marks 163, which are used as reference marks to maintain a constant interval between the second nozzle 150 and the substrate 160 and to precisely align the second nozzle 150 and the substrate 160 with respect to each other. As shown, there are three positioning marks 163 that are respectively formed in a left edge region, a center region, and a right edge region of the substrate 160. However, the present invention is not limited to the number and locations of such marks 163.

The open mask 175 is arranged on the substrate 160. If the substrate 160 is large enough to manufacture, the substrate 160 may include a plurality of deposition regions 161, and non-deposition regions 162 which are respectively positioned between adjacent deposition regions 161. In order to prevent deposition of the deposition material in the non-deposition regions 162, the open mask 175 is used. However, it is difficult to precisely adjust the interval between the second nozzle 150 and the substrate 160 and the positions thereof with a common open mask 175. Thus, in the thin film deposition apparatus 100 according to the shown embodiment of the present invention, the open mask 175 is arranged such as to expose a region of the substrate 160 that extends in the same direction (i.e., the Z-axis direction) as a direction in which the second nozzle 150 is moved. In other words, the open mask 175 is arranged not to overlap the regions of the substrate 160 where the positioning marks 163 are formed, thereby allowing adjustments to the interval between the second nozzle 150 and the substrate 160 and the positions thereof.

The rails 177 are disposed on opposite sides of the substrate 160. The base frame 171 is inserted between the rails 177. The base frame 171 is moved up and down in the Z-axis direction along the rails 177 due to a driving force of a motor (not shown). While not required, the base frame 171 can have wheels which allow the base frame 171 to move relative to the rails 177, but the invention is not limited thereto.

All the elements of the thin film deposition apparatus 100 that are involved in maintaining a constant interval between the second nozzle 150 and the substrate 160 and in precisely aligning the second nozzle 150 and the substrate 160 with respect to each other (i.e., the second nozzle 150) the second nozzle frame 155, the tray 173, the interval control member and the alignment control member are disposed on the base frame 171. In other words, the tray 173 is mounted on the base frame 171, and the second nozzle frame 155 is installed in the tray 173. In addition, the interval control member is disposed between the tray 173 and the second nozzle frame 155, and the alignment control member is disposed between the base frame 171 and the tray 173.

While not required in all aspects, the weight of the base frame 171 may be as light as possible. In addition, motors (not shown) are disposed on opposite sides of the base frame 171 and move the base frame 171 in the Z-axis direction. The motors may provide a driving force sufficient to drive all the elements disposed on the base frame 171. In addition, the motors have to be operable in a vacuum and have to have the same moving speed and sufficiently low vibration. The moving speed of the motors in the Z-axis direction may not be precisely controlled. However, in order to minimize vibration when the motors are operating, the motors have to be moved at a speed as constant as possible.

The tray 173 is disposed on the base frame 171. The second nozzle frame 155 is installed to be detachable from the tray 173. In particular, when the second nozzle frame 155 is installed in the tray 173, the second nozzle frame 155 is prevented from moving in the Y-axis and Z-axis directions. However, the second nozzle frame 155 is movable to some extent in the X-axis direction within the tray 173 when the second nozzle frame 155 is installed in the tray 173. In other words, the interval between the substrate 160 and the second nozzle 150 may be adjusted by moving the second nozzle frame 155 relative to the tray 173 in the X-axis direction.

In addition, the tray 173 is moved relative to the base frame 171 in the Y-axis and Z-axis directions by a first alignment adjusting actuator 191 and a second alignment adjusting actuator 192, which will be described later. However, the tray 173 is fixed not to move in the X-axis direction. In other words, the second nozzle 150 and the substrate 160 may be precisely aligned with each other in the Y-axis and Z-axis directions by moving the tray 173 relative to the base frame 171 along the YZ plane using the actuators 191,192.

The interval control member includes a first interval adjusting actuator 181, a second interval adjusting actuator 182, a third interval adjusting actuator 183, and first through fourth interval adjusting sensors 185a, 185b, 185c and 185d. The first interval adjusting actuator 181, the second interval adjusting actuator 182, and the third interval adjusting actuator 183 may be installed between the tray 173 and the second nozzle frame 155. The first through fourth interval adjusting sensors 185a, 185b, 185c and 185d may be mounted on the second nozzle frame 155 as shown. However, the location and numbers of the sensors and actuators can be adjusted in other aspects of the invention.

In particular, an actuator generically refers to a driving apparatus using electricity, hydraulic pressure, compressed air, or the like. In particular, an actuator refers to, in the mechatronics field, an electrical motor with a kind of control tool, or a piston or cylinder machine operated by hydraulic pressure or air pressure.

In the shown embodiment of the present invention, the first interval adjusting actuator 181 is disposed between a side of the tray 173 (i.e., a left side of the tray 173) and the second nozzle frame 155, to adjust the interval between the second nozzle frame 155 or the second nozzle 150 enclosed by the second nozzle frame 155, and the substrate 160. The second interval adjusting actuator 182 is disposed between an opposite side of the tray 173 (i.e., a right side of the tray 173) and the second nozzle frame 155, to adjust the interval between the second nozzle frame 155 or the second nozzle 150 enclosed by the second nozzle frame 155, and the substrate 160. The third interval adjusting actuator 183 is disposed on a base of the tray 173 (i.e., at a bottom center of the tray 173) to adjust the interval between the second nozzle frame 155 (and the second nozzle 150 enclosed by the second nozzle frame 155) and the substrate 160.

Herein, piezoelectric motors may be used as the first interval adjusting actuator 181, the second interval adjusting actuator 182, and the third interval adjusting actuator 183. A piezoelectric motor, which is a kind of an electrical motor generating a driving force from a piezoelectric material that deforms as an electrical field is applied, is widely used as a small-sized actuator producing a strong driving force.

In addition, the first through fourth interval adjusting sensors 185a, 185b, 185c and 185d are shown mounted on the four corners of the second nozzle frame 155, respectively. The first through fourth interval adjusting sensors 185a, 185b, 185c and 185d measure the interval between the second nozzle frame 155 and the substrate 160. The first through fourth interval adjusting sensors 185a, 185b, 185c and 185d may measure the interval between the second nozzle frame 155 and the substrate 160 using laser, but the invention is not limited thereto. Herein, the first through fourth interval adjusting sensors 185a, 185b, 185c and 185d measure the interval between the second nozzle frame 155 and the substrate 160 by using the positioning marks 163 on the substrate 160. A method of adjusting the interval between the second nozzle 150 and the substrate 160 by using the interval control member described above will be described later in detail with reference to FIG. 8.

The alignment control member includes the first alignment adjusting actuator 191, the second alignment adjusting actuator 192, and first through fourth alignment adjusting sensors 195a, 195b, 195c and 195d. The first alignment adjusting actuator 191 and the second alignment adjusting actuator 192 may be installed between the base frame 171 and the tray 173 as shown. The first through fourth alignment adjusting sensors 195a, 195b, 195c and 195d may be mounted on the second nozzle frame 155 as shown. However, the number and location of the alignment actuators and sensors is not limited.

In the current embodiment of the present invention, the first alignment adjusting actuator 191 is disposed between a side of the base frame 171 (i.e., a left side of the base frame 171) and the left side of the tray 173, to adjust the alignment among the tray 173, the second nozzle 150 installed in the tray 173, and the substrate 160 in the Y-axis direction.

The second alignment adjusting actuator 192 is disposed between a base of the base frame 171 and a bottom of the tray 173, and in particular, between a right base region of the base frame 171 and a right bottom edge of the tray 173. The second alignment adjusting actuator 192 controls rotation angles of the tray 173 and the second nozzle 150 with respect to the substrate 160, and thus to adjust alignment between the second nozzle 150 and the substrate 160.

While not required in all aspects, the first through fourth alignment adjusting sensors 195a, 195b, 195c and 195d are shown mounted on the four corners of the second nozzle frame 155, respectively. The first through fourth alignment adjusting sensors 195a, 195b, 195c and 195d measure whether the second nozzle frame 155 and the substrate 160 are aligned with each other. The first through fourth alignment adjusting sensors 195a, 195b, 195c and 195d may measure whether the second nozzle frame 155 and the substrate 160 are aligned with each other, by using laser. Herein, the first through fourth adjustment adjusting sensors 195a, 195b, 195c and 195d may measure whether the second nozzle frame 155 and the substrate 160 are aligned with each other, by using the positioning marks 163 on the substrate 160. A method of aligning the second nozzle 150 and the substrate 160 with each other by using the alignment control member will be described later in detail with reference to FIGS. 9A and 9B. While shown using sensors 195a through 195d in addition to sensors 185a through 185d, it is understood that the two sets of sensors could be combined to only four or fewer sensors commonly used by both the interval and alignment control members.

Figure 8:
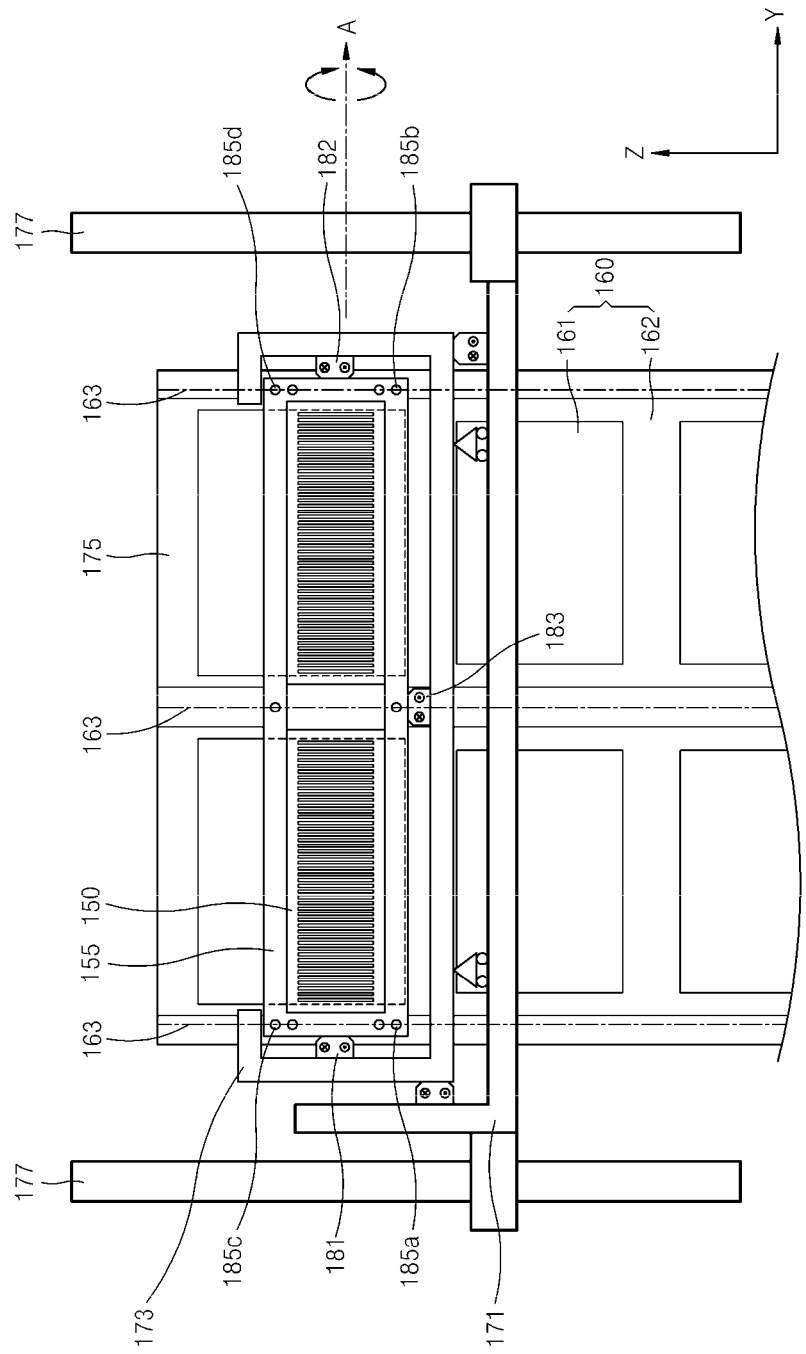
FIG. 8 is a front view for describing a method of adjusting an interval between a second nozzle and a substrate in the thin film deposition apparatus of FIG. 7 to be constant by using the interval control member, according to an embodiment of the present invention.

A method of adjusting the interval between the second nozzle 150 and the substrate 160 to be constant by using the interval control member will now be described in detail. FIG. 8 is a front view for describing a method of adjusting the interval between the second nozzle 150 and the substrate 160 to be constant by using the interval control member, according to an embodiment of the present invention. Referring to FIG. 8, three actuators 181, 182, 183 are used in order to adjust the interval between the second nozzle 150 and the substrate 160, as described above.

Initially, the second nozzle frame 155 is moved relative to the tray 173 in the X-axis direction by a predetermined distance by driving the first interval adjusting actuator 181, such that an average of the intervals between the second nozzle 150 and the substrate 160 measured by the first interval adjusting sensor 185a and the third interval adjusting sensor 185c reaches a desired value (for example, 100 μm). For example, if the average of the intervals between the second nozzle 150 and the substrate 160 measured by the first interval adjusting sensor 185a and the third interval adjusting sensor 185c is greater than the desired value, the first interval adjusting actuator 181 moves the second nozzle frame 155 relative to the tray 173 such that a region of the second nozzle frame 155 in which the first interval adjusting actuator 181 is disposed is shifted closer to the substrate 160. In contrast, if the average of the intervals between the second nozzle 150 and the substrate 160 measured by the first interval adjusting sensor 185a and the third interval adjusting sensor 185c is smaller than the desired value, the first interval adjusting actuator 181 moves the second nozzle frame 155 relative to the tray 173 such that the region of the second nozzle frame 155 in which the first interval adjusting actuator 181 is disposed is shifted away from the substrate 160.

Similarly, the second nozzle frame 155 is moved relative to the tray 173 in the X-axis direction by a predetermined distance by driving the second interval adjusting actuator 182, such that an average of the intervals between the second nozzle 150 and the substrate 160 measured by the second interval adjusting sensor 185b and the fourth interval adjusting sensor 185d reaches a desired value (for example, 100 μm). For example, if the average of the intervals between the second nozzle 150 and the substrate 160 measured by the second interval adjusting sensor 185b and the fourth interval adjusting sensor 185d is greater than the desired value, the second interval adjusting actuator 182 moves the second nozzle frame 155 relative to the tray 173 such that a region of the second nozzle frame 155 in which the second interval adjusting actuator 182 is disposed is shifted closer to the substrate 160. In contrast, if the average of the intervals between the second nozzle 150 and the substrate 160 measured by the second interval adjusting sensor 185b and the fourth interval adjusting sensor 185d is smaller than the desired value, the second interval adjusting actuator 182 moves the second nozzle frame 155 relative to the tray 173 such that the region of the second nozzle frame 155 in which the second interval adjusting actuator 182 is disposed is shifted away from the substrate 160.

As described above, the intervals between the second nozzle 150 and the substrate 160 on the left and right sides are adjusted by controlling the average of the intervals measured by the first interval adjusting sensor 185a and the third interval adjusting sensor 185c and the average of the intervals measured by the second interval adjusting sensor 185b and the fourth interval adjusting sensor 185d. Thus, in order to reduce a variation between the intervals measured by the first interval adjusting sensor 185a and the third interval adjusting sensor 185c and a variation between the intervals measured by the second interval adjusting sensor 185b and the fourth interval adjusting sensor 185d, the second nozzle frame 155 is rotated relative to the tray 173 around an axis A in FIG. 8 by driving the third interval adjusting actuator 183.

In other words, if the intervals between the second nozzle 150 and the substrate 160 measured by the first interval adjusting sensor 185a and the second interval adjusting sensor 185b are respectively greater than the intervals between the second nozzle 150 and the substrate 160 measured by the third interval adjusting sensor 185c and the fourth interval adjusting sensor 185d, the second nozzle frame 155 is moved by driving the third interval adjusting actuator 183 such that a region of the second nozzle frame 155 in which the third interval adjusting actuator 183 is disposed is shifted closer to the substrate 160. In contrast, if the intervals between the second nozzle 150 and the substrate 160 measured by the first interval adjusting sensor 185a and the second interval adjusting sensor 185b are respectively less than the intervals between the second nozzle 150 and the substrate 160 measured by the third interval adjusting sensor 185c and the fourth interval adjusting sensor 185d, the second nozzle frame 155 is moved by driving the third interval adjusting actuator 183 such that the region of the second nozzle frame 155 in which the third interval adjusting actuator 183 is disposed is shifted away from the substrate 160.

As described above, by adjusting the interval between the second nozzle 150 and the substrate 160 by using the first through third interval adjusting actuators 181, 182, and 183 and the first through fourth interval adjusting sensors 185a, 185b, 185c and 185d, the position of the pattern is maintained consistent, and the reliability of products is improved. In addition, when a larger substrate is used, the interval between the second nozzle 150 and the substrate 160 may be precisely adjusted by using greater numbers of interval adjusting actuators and interval adjusting sensors.

Hereinafter, a method of aligning the second nozzle 150 and the substrate 160 with each other by using the alignment control member will be described in detail. FIGS. 9A and 9B are front views for describing a method of adjusting alignment between the second nozzle 150 and the substrate 160 in the thin film deposition apparatus 100 by using the adjustment control member, according to an embodiment of the present invention. Referring to FIGS. 9A and 9B, two actuators 191, 192 are used in order to align the second nozzle 150 and the substrate 160 with each other, as described above. For convenience of explanation, the second nozzle 150 in FIG. 7 and the open mask 175 in FIG. 7 are not illustrated in FIGS. 9A and 9B. While described in terms of two actuators 191, 192, it is understood that other numbers of actuators can be used in other aspects of the invention.

Initially, referring to FIG. 9A, the first alignment adjusting sensor 195a, the second alignment adjusting sensor 195b, the third alignment adjusting sensor 195c and the fourth alignment adjusting sensor 195d are used to measure Y-axis directional relative positions of the positioning marks 163 in the substrate 160 and alignment marks (not shown) in the second nozzle frame 155. If the substrate 160 and the second nozzle frame 155 are not aligned with each other, the tray 173 is moved by a predetermined distance in the Y-axis direction by driving the first alignment adjusting actuator 191, to align the substrate 160 and the second nozzle frame 155 with each other in the Y-axis direction. Herein, the amount of movement of the tray 173 in the Y-axis direction may be set to be an average difference between the distances from the positioning marks 163 in the substrate 160 to the alignment marks in the second nozzle frame 155 measured by the first through fourth alignment sensors 195a, 195b, 195c, and 195d. As shown, the tray 173 is supported relative to the base frame 171 using wheels which allow movement in the Y direction.

For example, if the second nozzle frame 155 is biased to the right side of the substrate 160 (see dashed lines in FIG. 9A), the second nozzle frame 155 is moved relative to the substrate 160 by a predetermined distance in a direction of an arrow B by driving the first alignment adjusting actuator 191, to align the substrate 160 and the second nozzle frame 155 with each other in the Y-axis direction.

In addition, the second nozzle 150 and the substrate 160 may not be aligned with each other when the second nozzle 150 is rotated relative to the substrate 160 by a predetermined angle. In this case, the second nozzle 150 may be rotated in an opposite direction by the predetermined angle in order to align the second nozzle 150 and the substrate 160 with each other.

Referring to FIG. 9B, the tray 173 is rotated by a predetermined angle by driving the second alignment adjusting actuator 192 such that the difference between the distances from the positioning marks 163 in the substrate 160 to the alignment marks in the second nozzle frame 155 measured by the first alignment adjusting sensor 195a and the third alignment adjusting sensor 195c and the difference between the distances from the positioning marks 163 in the substrates 160 to the alignment marks in the second nozzle frame 155 measured by the second alignment adjusting sensor 195b and the fourth alignment adjusting sensor 195d are to be zero. Thus, the substrate 160 and the second nozzle frame 155 are aligned with each other.

When the second nozzle frame 155 is tilted counterclockwise with respect to the positioning marks 163 (see dashed lines in FIG. 9B), the second alignment adjusting actuator 192 rotates the second nozzle frame 155 clockwise (i.e. in a direction of an arrow C) relative to the substrate 160. When the second nozzle frame 155 is tilted clockwise with respect to the positioning marks 163, the second alignment adjusting actuator 192 rotates the second nozzle frame 155 counterclockwise.

As described above, by precisely aligning the second nozzle 150 and the substrate 160 with each other by using the two alignment adjusting actuators 191 and 192 and the first through fourth adjustment adjusting sensors 195a, 195b, 195c and 195d, a precise thin film pattern may be formed on the substrate 160 while the second nozzle 150 is moved.

Hereinafter, a thin film deposition apparatus 100 according to another embodiment of the present invention will be described with respect to FIGS. 10 and 11. The current embodiment differs from the previous embodiment described with reference to FIG. 6 only in terms of the structure of the interval control members. Thus, a detailed description of the elements denoted by the same reference numerals as used in FIG. 6 will not be provided here.

Figure 10:
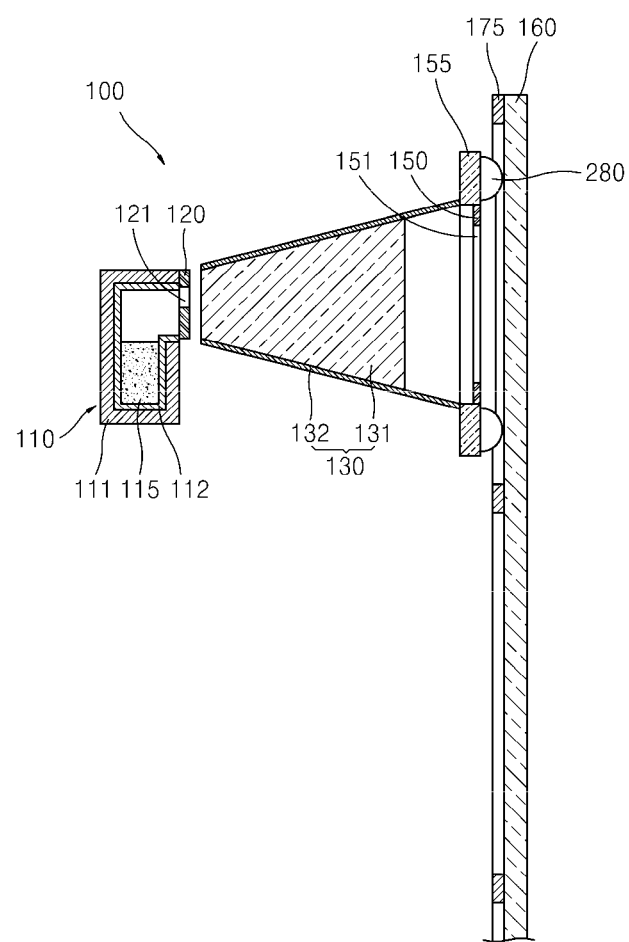
FIG. 10 is a schematic perspective view of a thin film deposition apparatus according to another embodiment of the present invention.
Figure 11:
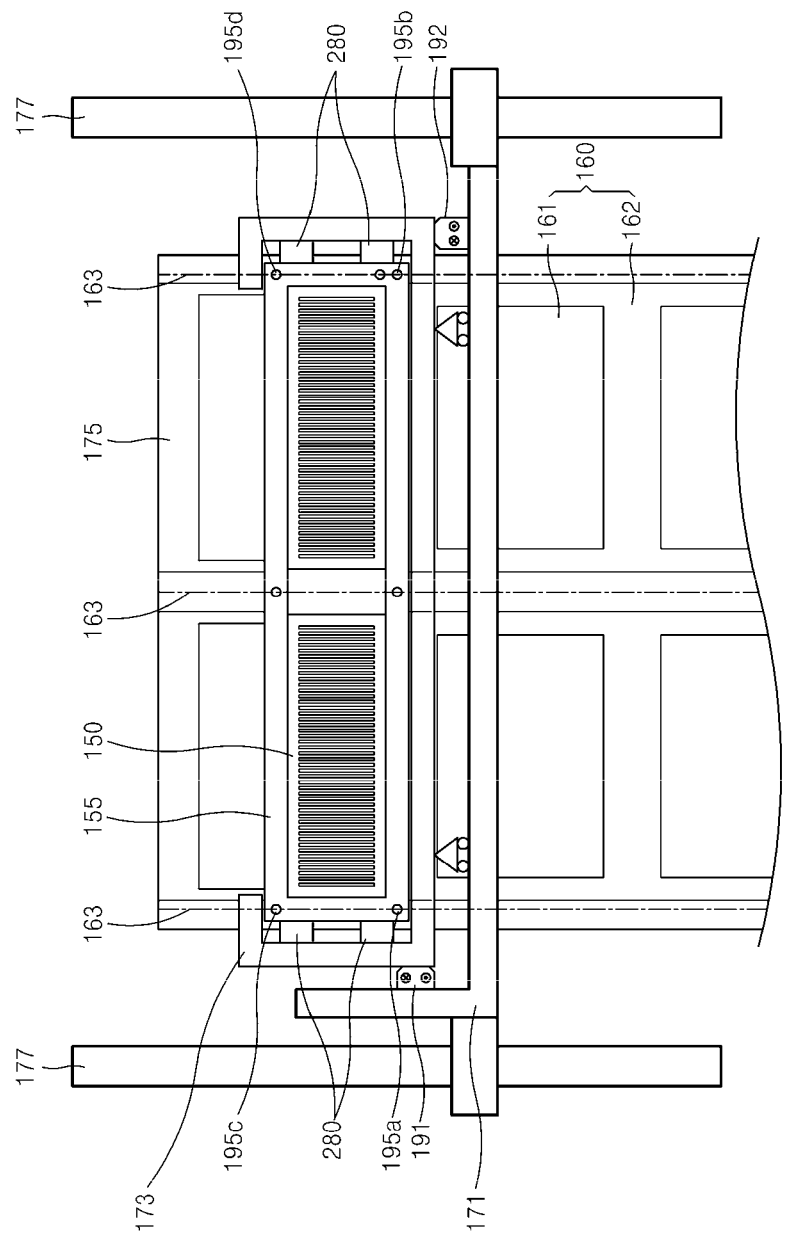
FIG. 11 is a front view of the thin film deposition apparatus of FIG. 10, illustrating an interval control member and an alignment control member according to an embodiment of the present invention.

FIG. 10 is a schematic perspective view of the thin film deposition apparatus and FIG. 11 is a front view of the thin film deposition apparatus 100 of FIG. 10, illustrating an interval control member 280 and an alignment control member (not shown) according to an embodiment of the present invention. For convenience of explanation, all the elements of the thin film deposition apparatus 100 of FIG. 10, excluding the second nozzle 150, the second nozzle frame 155 and the substrate 160, are not illustrated in FIG. 11.

Referring to FIGS. 10 and 11, the thin film deposition apparatus 100 includes a deposition source 110, a first nozzle 120, a barrier wall assembly 130, the second nozzle 150, the second nozzle frame 155, the substrate 160, the alignment control member (not shown) and the interval control member 280.

Figure 12A:
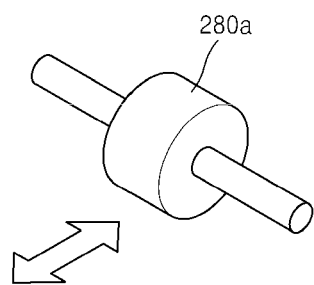
FIG. 12A illustrates a roller constituting an interval control member according to an embodiment of the present invention.
Figure 12B:
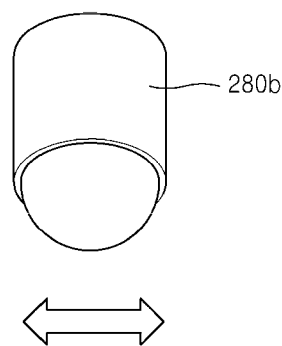
FIG. 12B illustrates a ball constituting an interval control member, according to another embodiment of the present invention.

FIG. 12A illustrates the interval control member 280 comprising a roller 280a, according to an embodiment of the present invention. Referring to FIG. 12A, the roller 280a is attached to each of the four corners of the second nozzle frame 155. FIG. 12B illustrates the interval control member 280 comprising a ball 280b, according to another embodiment of the present invention. As illustrated in FIG. 12B, the ball 280b is attached to each of the four corners of the second nozzle frame 155. Diameters of the rollers 280a or the balls 280b, and diameters of axes thereof (not shown) may be precisely processed. If the interval control member 280 comprises the balls 280b, regions of the second nozzle frame 155 that contact the balls 280b may be precisely processed.

The interval control member 280 according to the current embodiment of the present invention can be the rollers 280a and/or the balls 280b, may be manufactured to have a slightly lower degree of precision compared to the interval control member (i.e., the actuators 181,182,183) according to the previous embodiment described with reference to FIG. 6. However, the interval control member 280 has a simple structure, may be easily manufactured, and does not interfere with the open mask 175. In other words, the interval control member 280 according to the current embodiment has a structure pressing the substrate 160, and thus the open mask 175 may be disposed under the interval control member 280. Thus, the open mask 175 may be installed relatively easily.

Figure 13:
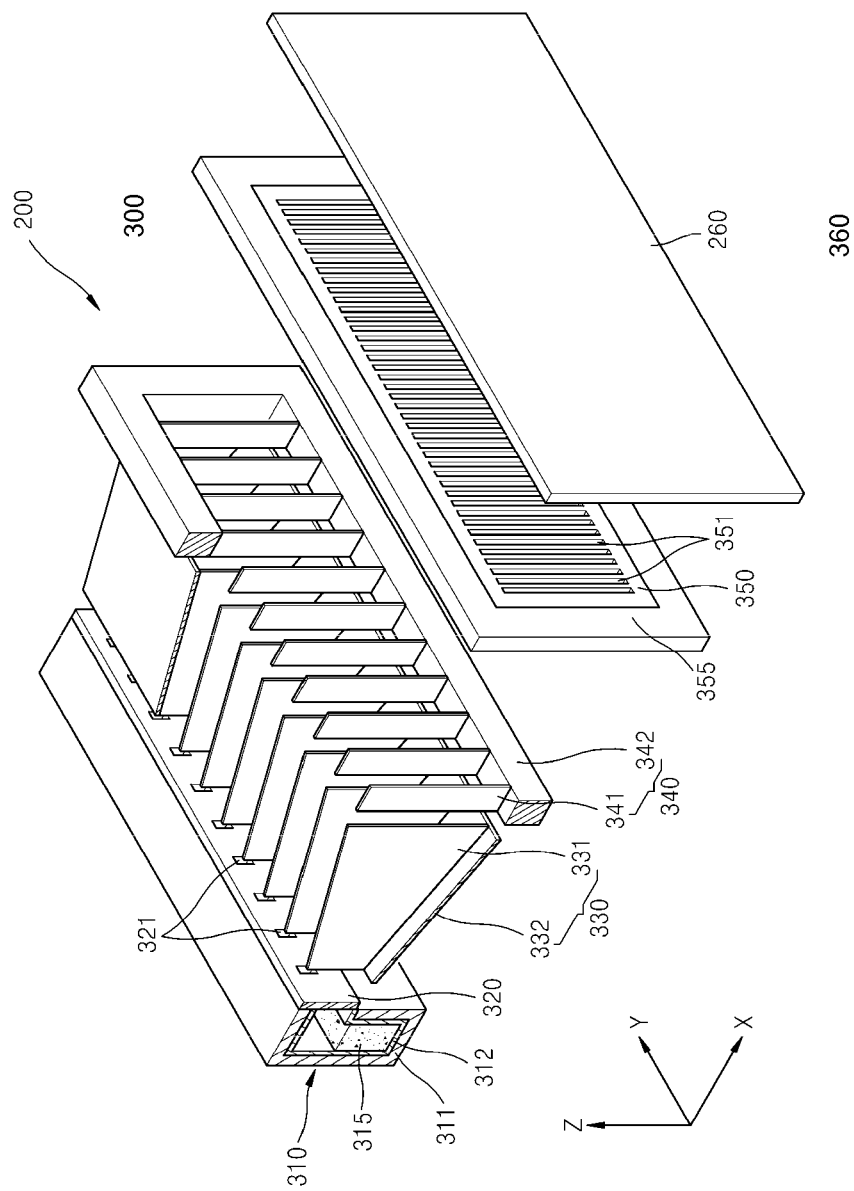
FIG. 13 is a cross-sectional side view of a thin film deposition apparatus according to another embodiment of the present invention.

Hereinafter, a thin film deposition apparatus 300 according to another embodiment of the present invention will be described. The current embodiment differs from the previous embodiment described with reference to FIG. 6 only in terms of the structure of the barrier wall assembly. FIG. 13 is a schematic perspective view of the thin film deposition apparatus 300 according to an embodiment of the present invention. Referring to FIG. 13, the thin film deposition apparatus 300 a deposition source 310, a first nozzle 320, a first barrier wall assembly 330, a second barrier wall assembly 340, a second nozzle 350, a second nozzle frame 355, and a substrate 360.

Although a chamber is not illustrated in FIG. 13 for convenience of explanation, all the components of the thin film deposition assembly 300 may be disposed within a chamber that is maintained at an appropriate degree of vacuum. The chamber is maintained at an appropriate vacuum in order to allow a deposition material to move in a substantially straight line through the thin film deposition apparatus 300.

The substrate 360 comprises a deposition target on which a deposition material 315 is to be deposited. The substrate 360 is disposed in the chamber. The deposition source 310 that contains and heats the deposition material 315 and is disposed on a side of the chamber opposite to a side in which the substrate 360 is disposed. The shown deposition source 310 includes a crucible 311 and a heater 312, but the invention is not limited thereto.

The first nozzle 320 is disposed at a side of the deposition source 310 facing the substrate 360. The first nozzle 320 includes a plurality of first slits 321 arranged at equal intervals in a Y-axis direction, with each first slit 321 being elongated in the Z-axis direction.

The first barrier wall assembly 330 is disposed at a side of the first nozzle 320. The first barrier wall assembly 330 includes a plurality of first barrier walls 331, and a first barrier wall frame 332 that covers sides of the first barrier walls 331.

The second barrier wall assembly 340 is disposed at a side of the first barrier wall assembly 330. The second barrier wall assembly 340 includes a plurality of second barrier walls 341, and a second barrier wall frame 342 that covers sides of the second barrier walls 341.

The second nozzle 350 and the second nozzle frame 355 are disposed between the deposition source 310 and the substrate 360. The second nozzle frame 355 may be formed in a lattice shape, similar to a window frame as shown. The second nozzle 350 is bound inside the second nozzle frame 355. The second nozzle 350 includes a plurality of second slits 351 arranged at equal intervals in the Y-axis direction, with each second slit 351 being elongated in the Z-axis direction.

The thin film deposition assembly 300 includes two separate barrier wall assemblies: the first barrier wall assembly 330 and the second barrier wall assembly 340. However, the number of assemblies is not specifically limited and can be greater than two in other aspects.

The plurality of first barrier walls 331 are arranged parallel to each other at equal intervals in the Y-axis direction. In addition, each of the first barrier walls 331 may be formed to extend along an XZ plane in FIG. 13 (i.e., perpendicular to the Y-axis direction).

The plurality of second barrier walls 341 are arranged parallel to each other at equal intervals in the Y-axis direction. In addition, each of the second barrier walls 341 is formed to extend along the XZ plane in FIG. 13 (i.e., perpendicular to the Y-axis direction).

The plurality of first barrier walls 331 and the plurality of second barrier walls 341, arranged as described above, partition the space between the first nozzle 320 and the second nozzle 350. In the thin film deposition apparatus 300, the deposition space is divided by the first barrier walls 331 and the second barrier walls 341 into sub-deposition spaces that respectively correspond to the first slits 321 through which the deposition material 315 is discharged.

The second barrier walls 341 are disposed to correspond to the first barrier walls 331. The second barrier walls 341 may be respectively aligned with the first barrier walls 331 to be parallel thereto on the same plane as the first barrier walls 331. Each pair of the corresponding first and second barrier walls 331 and 341 may be located on the same plane. As described above, since the space between the first nozzle 320 and the second nozzle 350 is partitioned by the first barrier walls 331 and the second barrier walls 341, the deposition material 315 discharged through each of the first slits 321 is not mixed with the deposition material 315 discharged through the other first slits 321, and is deposited on the substrate 360 through the second slits 351. The first barrier walls 331 and the second barrier walls 341 guide the deposition material 315, which is discharged through the first slits 321, so as not to flow in the Y-axis direction.

Although the first barrier walls 331 and the second barrier walls 341 are respectively illustrated as having the same thickness in the Y-axis direction, aspects of the present invention are not limited thereto. The second barrier walls 341, which should be accurately aligned with the second nozzle 350, may be formed to be relatively thin. The first barrier walls 331, which do not need to be precisely aligned with the second nozzle 350, may be formed to be relatively thick. This makes it easier to manufacture the thin film deposition apparatus 300.

Although not illustrated, the thin film deposition apparatus 300 may further include an interval control member and an alignment control member. The interval control member may be constituted by actuators and sensors as in the embodiments described with reference to FIGS. 7 to 9, or alternatively, by rollers or balls as in the embodiments described with reference to FIGS. 10 to 12B. The alignment control member according to the current embodiment of the present invention may be constituted by actuators and sensors as in the embodiments described with reference to FIGS. 7 to 11. Since the interval control member and the alignment control member have been described in detail in the previous embodiments, a detailed description thereof will not be provided here.

Hereinafter, a thin film deposition apparatus 900 according to another embodiment of the present invention will be described in relation to FIGS. 14 to 16. The current embodiment differs from the previous embodiment described with reference to FIG. 1 in that no barrier wall assembly is used.

Figure 14:
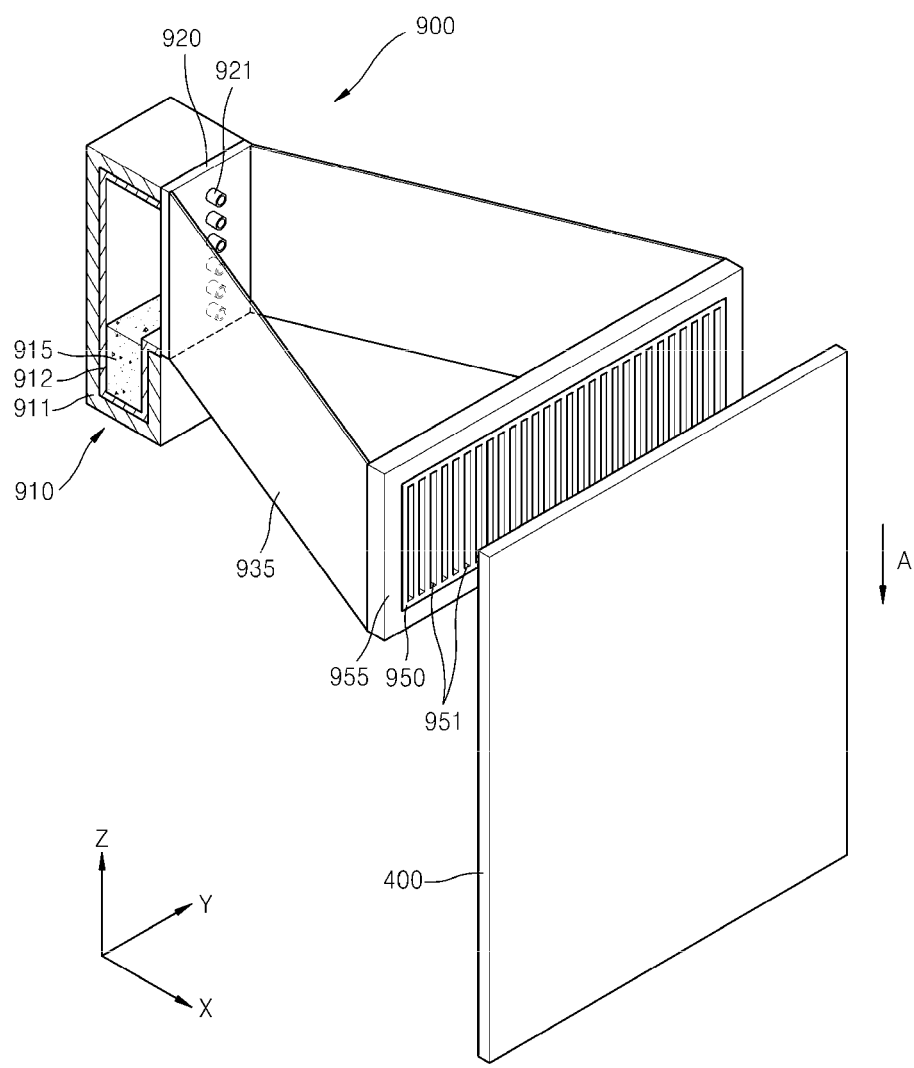
FIG. 14 is a schematic perspective view of a thin film deposition apparatus according to another embodiment of the present invention.
Figure 15:
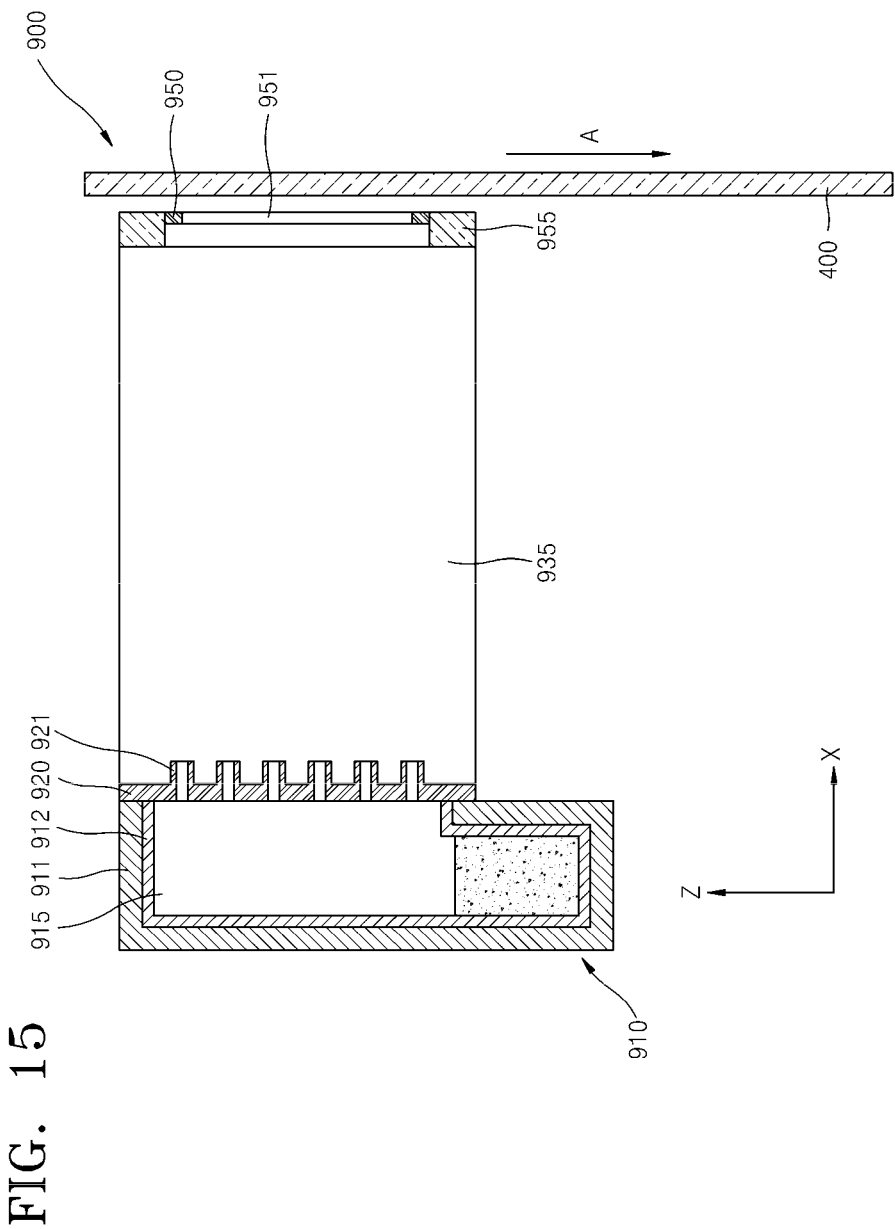
FIG. 15 is a schematic side view of the thin film deposition apparatus of FIG. 14, according to an embodiment of the present invention.
Figure 16:
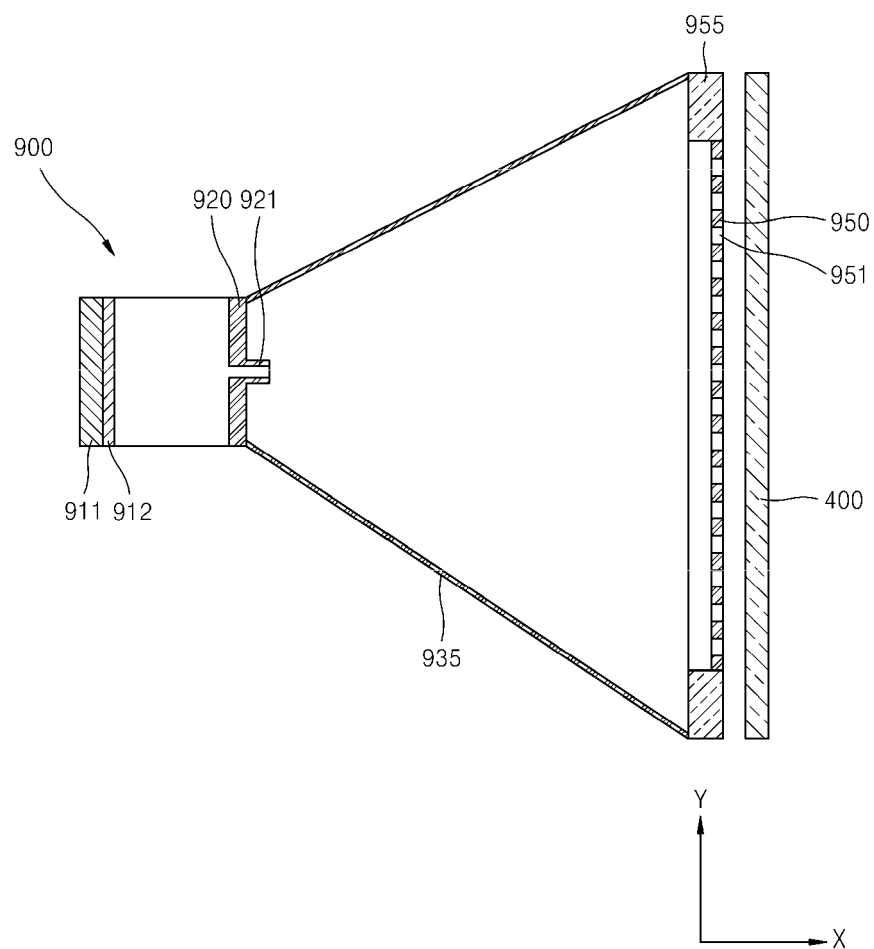
FIG. 16 is a schematic plan view of the thin film deposition apparatus of FIG. 14, according to an embodiment of the present invention.

FIG. 14 is a schematic perspective view of the thin film deposition apparatus 900 according to an embodiment of the present invention, FIG. 15 is a schematic side view of the thin film deposition apparatus 900, and FIG. 16 is a schematic plan view of the thin film deposition apparatus 900. Referring to FIGS. 14, 15 and 16, the thin film deposition apparatus 900 according to the current embodiment of the present invention includes a deposition source 910, a first nozzle 920, and a second nozzle 950.

Although a chamber is not illustrated in FIGS. 14, 15 and 16 for convenience of explanation, all the components of the thin film deposition assembly 900 may be disposed within a chamber that is maintained at an appropriate degree of vacuum. The chamber is maintained at an appropriate vacuum in order to allow a deposition material to move in a substantially straight line through the thin film deposition apparatus 900.

In order to deposit the deposition material 915 that is emitted from the deposition source 910 and discharged through the first nozzle 920 and the second nozzle 950 on a substrate 400 in a desired pattern, the chamber should be maintained in a high-vacuum state as in a deposition method using a fine metal mask (FMM). In addition, the temperature of the second nozzle 950 has to be sufficiently lower than the temperature of the deposition source 910. In this regard, the temperature of the second nozzle 950 may be about 100° C. or less. The temperature of the second nozzle 950 should be sufficiently low so as to reduce thermal expansion of the second nozzle 950.

The substrate 400 is a deposition target on which the deposition material 915 is to be deposited. The substrate 400 is disposed in the chamber. The substrate 400 may be a substrate for flat panel displays. A large substrate, such as a mother glass, for manufacturing a plurality of flat panel displays, may be used as the substrate 400. Other substrates may also be employed.

In the shown embodiment of the present invention, deposition may be performed while the substrate 400 and the thin film deposition apparatus 900 are moved relative to each other. In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition apparatus 900, deposition is performed while the thin film deposition apparatus 900 and/or the substrate 400 is moved relative to each other. In other words, deposition may be continuously performed while the substrate 400, which is disposed such as to face the thin film deposition apparatus 900, is moved in the Y-axis direction. Deposition is performed in a scanning manner while the substrate 400 is moved in a direction of arrow A in FIG. 14. Although the substrate 400 is illustrated as being moved in the Y-axis direction in FIG. 14 when deposition is performed, the present invention is not limited thereto. Deposition may be performed while the thin film deposition apparatus 900 is moved in the Y-axis direction, whereas the substrate 400 is fixed, or where both the apparatus 900 and substrate 400 move.

Thus, in the thin film deposition apparatus 900, the second nozzle 950 may be significantly smaller than a FMM used in a conventional deposition method. In other words, in the thin film deposition apparatus 900, deposition is continuously performed in a scanning manner while the substrate 400 is moved in the Y-axis direction. Thus, lengths of the second nozzle 950 in the X-axis and Y-axis directions may be significantly less than the lengths of the substrate 400 in the X-axis and Y-axis directions. As described above, since the second nozzle 950 may be significantly smaller than a FMM used in a conventional deposition method, it is relatively easy to manufacture the second nozzle 950. The use of the second nozzle 950, which is smaller than a FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition apparatus 900 or the substrate 400 is moved relative to each other as described above, the thin film deposition assembly 900 and the substrate 400 may be separated from each other by a predetermined distance.

The deposition source 910 contains and heats the deposition material 915. The deposition source 910 is disposed in on a side of the chamber that is opposite a side on which the substrate 400 is disposed. After being vaporized in the deposition source 910, the deposition material 915 is deposited on the substrate 400.

The deposition source 910 includes a crucible 911 and a heater 915. The crucible 911 holds the deposition material 915. The heater 911 heats the crucible 911 to vaporize the deposition material 915 contained in the crucible 912 towards a side of the crucible 911, and in particular, towards the first nozzle 920.

The first nozzle 920 is disposed at a side of the deposition source 910 facing the substrate 400. The first nozzle 920 includes a plurality of first slits 921 arranged at equal intervals in the Y-axis direction, with each first slit 921 being elongated in the Z-axis direction in which the substrate 400 is scanned. The deposition material 915 vaporized in the deposition source 910 passes through the first nozzle 920 towards the substrate 400. As described above, when the first nozzle 920 includes the plurality of first slits 921 arranged in the Z-axis direction (that is, the scanning direction of the substrate 400) a size of a pattern formed from the deposition material 910 discharged through the second slits 9510 of the second nozzle 950 is exclusively affected by the size of one first slit 921 (since this may be considered as if only one first slit 921 is disposed in the Y-axis direction), and thus no shadow zone appears on the substrate 400. In addition, since the plurality of first slits 921 are arranged in the scanning direction of the substrate 400, even if there is a difference between fluxes of the first slits 921 of the first nozzle 920, the difference may be compensated for, thereby constantly maintaining deposition uniformity.

The second nozzle 950 and the second nozzle frame 955 are disposed between the deposition source 910 and the substrate 400 as shown, but the invention is not limited thereto. The second nozzle frame 955 may be formed in a lattice shape, similar to a window frame. The second nozzle 950 is bound inside the second nozzle frame 155. The second nozzle 950 includes a plurality of second slits 951 arranged at equal intervals in the Y-axis direction, with each second slit 951 being elongated in the Z-axis direction. The deposition material 915 vaporized in the deposition source 910. The vaporized deposition material 915 passes through the first nozzle 920 and the second nozzle 950 towards the substrate 400. The second nozzle 950 may be manufactured by etching, which is the same method as used in a conventional method of manufacturing an FMM, and in particular, a striped FMM. Herein, the total number of first slits 921 may be greater than the total number of second slits 951. However, the number of slits 921 and the manufacturing method is not specifically limited.

In addition, the first nozzle 920 is coupled to the deposition source 910. The deposition source 910 and the first nozzle 920 may be separated from the first nozzle 950 by a predetermined distance. The deposition source 910 and the first nozzle 950 coupled to the first nozzle 920 are connected to the second nozzle 950 by a connection member 935, as illustrated in FIG. 14. That is, the deposition source 910, the first nozzle 920 and the second nozzle 950 are integrally formed as one body due to their being connected to each other via the connection member 935. The connection member 935 guides the deposition material 915, which is discharged through the first slits 921, to move straight and not to flow in the Y-axis direction. Although the connection member 935 is illustrated as being disposed on left and right sides of the deposition source 910, the first nozzle 920 and the second nozzle 950 to guide the deposition material 915 not to flow in the Y-axis direction, the present invention is not limited thereto. For example, the connection member 935 may be formed as a sealed box to guide the flow of the deposition material 915 to not be in both the Z-axis and Y-axis directions.

As described above, the thin film deposition apparatus 900 according to the current embodiment of the present invention performs deposition while being moved relative to the substrate 400. In order to move the thin film deposition apparatus 900 relative to the substrate 400, the second nozzle 950 may be separated from the substrate 400 by a predetermined distance.

In particular, in a conventional deposition method using a FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition apparatus 900, the second nozzle 950 is disposed to be separated from the substrate 400 by a predetermined distance.

As described above, according to embodiments of the present invention, a mask is formed to be smaller than the substrate 400, and deposition is performed while the mask is moved relative to the substrate. Thus, the mask can be easily manufactured. In addition, defects caused due to the contact between a substrate and a FMM, which occur in the conventional deposition method, may be prevented. In addition, since it is unnecessary to dispose the FMM in close contact with the substrate during a deposition process, the manufacturing time may be reduced.

To this end, the thin film deposition apparatus 900 may optionally include an interval control member and an alignment control member. Thus, the interval between the second nozzle 950 and the substrate 400 may be maintained constant, and at the same time the second nozzle 950 and the substrate 400 may be precisely aligned with each other. Controlling the interval and alignment between the second nozzle 950 and the substrate 400 are described in the previous embodiments with reference to FIGS. 7 to 12B, and thus a detailed description thereof will not be provided here.

Hereinafter, a thin film deposition apparatus 900 according to another embodiment of the present invention will be described in relation to FIG. 17. A first nozzle 920 includes a plurality of first slits 921 that tilt at a predetermined angle, unlike the previous embodiment described with reference to FIGS. 14 to 16.

Figure 17:
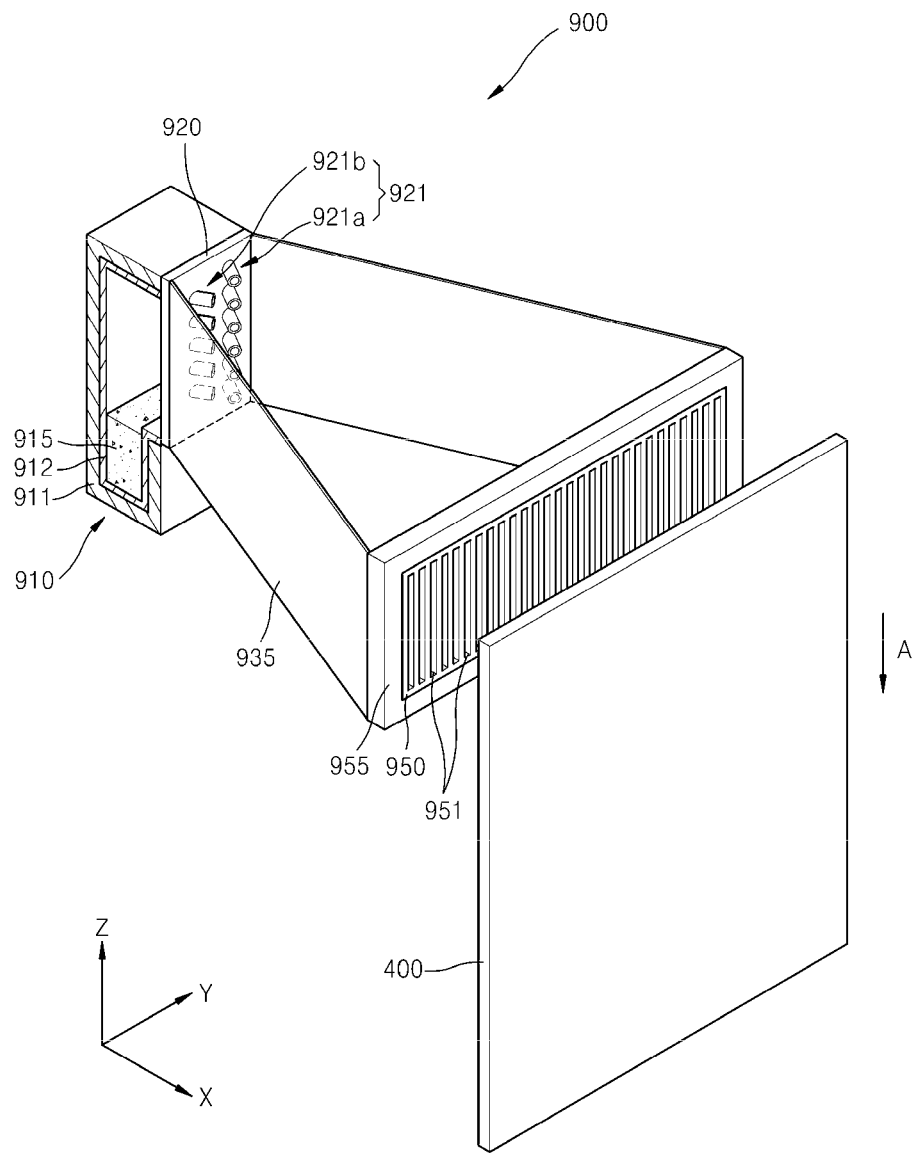
FIG. 17 is a schematic perspective view of a thin film deposition apparatus according to another embodiment of the present invention.

Referring to FIG. 17, the thin film deposition apparatus 900 includes a deposition source 910, the first nozzle 920, and a second nozzle 950. In particular, the deposition source 910 includes a crucible 911 that is filled with the deposition material 915, and a heater 911 that heats the crucible 911 to vaporize the deposition material 915, which is contained in the crucible 912, towards a side of the crucible 911, and in particular, towards the first nozzle 920. The first nozzle 920 is disposed at a side of the deposition source 910. The first nozzle 920 includes a plurality of first nozzles 921 arranged in the Z-axis direction. The second nozzle 950 and a second nozzle frame 955 are further disposed between the deposition source 910 and the substrate 400. The second nozzle 950 includes a plurality of second slits 951 arranged in the Y-axis direction. In addition, the first nozzle 920 is coupled to the deposition source 920. The second nozzle 950 is spaced apart from the first nozzle 920. The deposition source 910, the first nozzle 920, and the second nozzle 950 are connected by the connection member 935.

In the shown embodiment of the present invention, the first slits 921 of the first nozzle 920 are tilted at a predetermined angle. In particular, the first slits 921 include first slits 921*a* and 921*b* arranged in respective rows. The first slits 921*a* and 921*b* are arranged in respective rows to alternate in a zigzag pattern. Herein, the first slits 921*a* and 921*b* are tilted by a predetermined angle about the Z axis with respect to the XY plane.

Specifically, the first slits 921*a* and 921*b* are arranged to tilt by a predetermined angle. Herein, the first slits 921*a* are in a first row and the first slits 921*b* are in a second row. The first slits 921*a* of the first row in a left part of the first nozzle 920 tilt towards a right end portion of the second nozzle 950. The first slits 921*b* of the second row are a right part of the first nozzle 920 and tilt towards a left end portion of the second nozzle 950.

Figure 18:
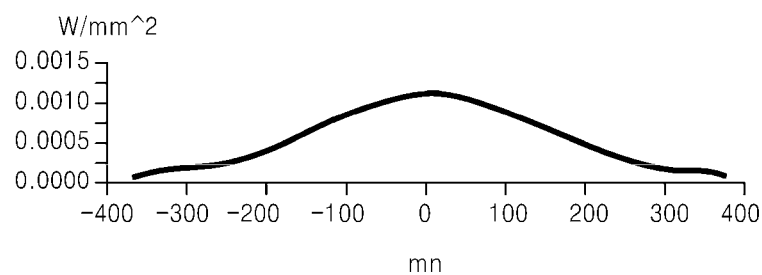
FIG. 18 is a graph schematically illustrating a thickness distribution of a deposition film that is formed on a substrate while first slits adjacent to a deposition source are tilted in a thin film deposition apparatus according to an embodiment of the present invention.
Figure 19:
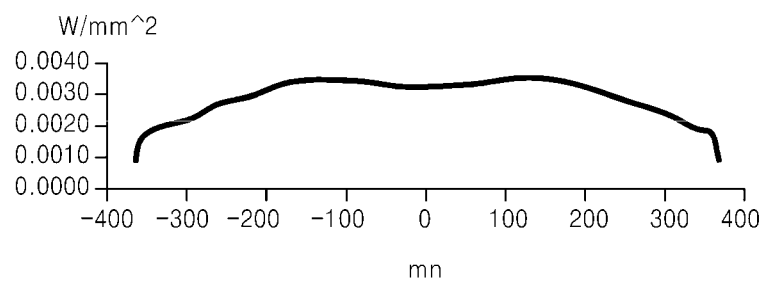
FIG. 19 is a graph schematically illustrating a thickness distribution of a deposition film that is formed on a substrate while first slits adjacent to a deposition source are tilted in the thin film deposition apparatus of FIG. 17.

FIG. 18 is a graph showing a thickness distribution of a deposition film that is formed on a substrate while the first slits 921*a* and 921*b* in the first nozzle 920, which is adjacent to the deposition source 910, are not tilted in the thin film deposition apparatus according to the current embodiment of the present invention. FIG. 19 is a graph showing a thickness distribution of a deposition film that is formed on a substrate while the first slits 920*a* and 920*b* are tilted as in the thin film deposition apparatus according to the current embodiment of the present invention. Comparing FIGS. 18 and 19, the thicknesses of the deposition film in opposite end portions of the substrate are relatively greater when the first slits 921*a* and 921*b* are tilted than when not tilted, thereby increasing uniformity of the deposition film.

Due to the structure of the thin film deposition apparatus 900 according to the current embodiment, the deposition of the deposition material 915 may be adjusted to lessen a thickness variation between the center and the end portions of the substrate 400 and improve thickness uniformity of the deposition film. Moreover, utilization efficiency of the deposition material 915 may also be improved.

Furthermore, the thin film deposition apparatus 900 according to the current embodiment of the present invention may include an interval control member and an alignment control member. Thus, the interval between the second nozzle 950 and the substrate 400 may be maintained constant, and at the same time the second nozzle 950 and the substrate 400 may be precisely aligned with each other. Controlling the interval and alignment between the second nozzle 950 and the substrate 400 are described in the previous embodiment with reference to FIGS. 7 to 12B, and thus a detailed description thereof will not be provided here.

A thin film deposition apparatus according to the present invention constructed as described above may be easily manufactured and may be simply applied to manufacture large-sized display devices on a mass scale. The thin film deposition apparatus may improve manufacturing yield and deposition efficiency and may have a structure that allows the interval between a nozzle and a substrate to be easily adjusted.

While shown as having both an alignment control member and an interval control member, it is understood that the thin film deposition apparatus need not have both an alignment control member and an interval control member in all aspects of the invention. Further, while shown as separate, it is understood that the alignment control member and the interval control member could be combined into a single adjustment member utilizing common actuators and/or sensors to adjust both the interval and alignment of the second nozzle with respect to the substrate.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a thin film on a substrate comprising:

passing vaporized deposition material through first slits of a first nozzle of a thin film deposition assembly, the first slits being arranged in a first direction;

passing the vaporized deposition material received from the first slits through second slits of a second nozzle of the thin film deposition assembly;

using an adjusting member comprising an actuator set to adjust an orientation of the second nozzle relative to a deposition target area on the substrate on which the deposition material from the second nozzle is to be deposited by moving the second nozzle relative to a base frame, a tray accommodating the second nozzle being arranged on the base frame; and depositing the deposition material from the second nozzle onto the deposition target area.

2. The method of claim 1, wherein:
the depositing further comprising creating relative motion between the second nozzle and the substrate to perform the deposition, and
the second nozzle is smaller than the deposition target area.

3. The method of claim 1, further comprising sensing a relative position of the second nozzle relative to the deposition target area, wherein the using adjusting member comprises adjusting the orientation of the second nozzle relative to the deposition target area according to the sensed relative position.

4. The method of claim 3, wherein the using the adjusting member comprises controlling the actuator set to adjust a position of the second nozzle relative to the deposition target area by moving the second nozzle in a plane substantially parallel to a surface of the deposition target area and/or to adjust a distance between the substrate and the second nozzle.

5. The method of claim 1, wherein a thin film deposition apparatus comprises the thin film deposition assembly and the thin film deposition apparatus comprises:
a deposition source;
the first nozzle disposed at a side of the deposition source and including the first slits arranged in the first direction;
the second nozzle disposed opposite to the first nozzle and including the second slits arranged in the first direction;
a barrier wall assembly including a plurality of barrier walls that are arranged in the first direction in order to partition a space between the first nozzle and the second nozzle; and
the adjusting member comprising an interval control member that adjusts an interval between the second nozzle and the substrate, and/or an alignment control member that adjusts an alignment between the second nozzle and the substrate.

6. The method of claim 5, wherein the adjusting member comprises the interval control member that adjusts the interval between the second nozzle and the substrate to be constant.

7. The method of claim 5, wherein the adjusting member comprises the interval control member, and wherein the interval control member comprises:
a sensor that senses a position of the second nozzle above the substrate; and
the actuator that provides a driving force to move the second nozzle relative to the substrate to adjust the interval according to the sensed position.

8. The method of claim 7, wherein the substrate comprises a positioning mark, and wherein the sensor senses the position of the second nozzle above the substrate based on the positioning mark.

9. The method of claim 8, further comprising an open mask that is arranged on the substrate not to overlap with the positioning mark.

10. The method of claim 7, wherein the interval control member comprises:
a first actuator that is disposed between a side of the second nozzle and the tray to move the second nozzle relative to the tray;
a second actuator that is disposed between a side of the second nozzle opposite to the side of the second nozzle on which the first actuator is disposed and the tray to move the second nozzle relative to the tray; and
a third actuator that rotates the second nozzle with respect to an axis parallel to the first direction.

11. The method of claim 7, wherein the actuator comprises a piezoelectric motor.

12. The method of claim 7, wherein the actuator and the sensor adjust the interval between the second nozzle and the substrate by real-time feedback control.

13. The method of claim 5, wherein the adjusting member comprises the interval control member, and wherein the interval control member comprises rollers and/or balls that are disposed at opposite end portions of the second nozzle and contact the substrate.

14. The method of claim 5, wherein the adjusting member comprises the alignment control member, and wherein the alignment control member adjusts a position of the second nozzle relative to the substrate to be constant.

15. The method of claim 5, wherein the adjusting member comprises the alignment control member, and wherein the alignment control member comprises:
a sensor that senses a position of the second nozzle relative to the substrate; and
the actuator that provides a driving force to move the second nozzle relative to the substrate to adjust the alignment according to the sensed position.

16. The method of claim 15, wherein the substrate comprises a positioning mark, and wherein the sensor senses the position of the second nozzle relative to the substrate based on the positioning mark.

17. The method of claim 16, further comprising an open mask that is arranged on the substrate not to overlap with the positioning mark.

18. The method of claim 15, wherein:
the actuator is disposed between a first side of the tray and the base frame to linearly move the tray relative to the base frame; and
the alignment control member further comprises another actuator that is disposed between a side of the tray adjacent to the first side and the base frame to rotatably move the tray relative to the base frame.

19. The method of claim 15, wherein the actuator comprises a piezoelectric motor.

20. The method of claim 15, wherein the actuator and the sensor adjust the alignment between the second nozzle and the substrate by real-time feedback control.

21. The method of claim 5, wherein each of the barrier walls extends in a second direction that is substantially perpendicular to the first direction, in order to partition the space between the first nozzle and the second nozzle.

22. The method of claim 5, wherein the plurality of barrier walls are arranged at equal intervals in the first direction.

23. The method of claim 5, wherein the barrier walls are separated from the second nozzle by a set distance.

24. The method of claim 5, wherein the barrier wall assembly is detachable from the thin film deposition apparatus.

25. The method of claim 5, wherein the barrier wall assembly comprises a first barrier wall assembly comprising a plurality of first barrier walls, and a second barrier wall assembly comprising a plurality of second barrier walls.

26. The method of claim 25, wherein each of the first barrier walls and each of the second barrier walls extend in a second direction that is substantially perpendicular to the first direction, in order to partition the space between the first nozzle and the second nozzle.

27. The method of claim 25, wherein the first barrier walls are arranged to align with the second barrier walls.

28. The method of claim 27, wherein each pair of the corresponding first and second barrier walls is arranged on substantially the same plane.

29. The method of claim 5, wherein a deposition material vaporized in the deposition source is deposited on the substrate by being discharged through the first nozzle and the second nozzle.

30. The method of claim 5, wherein the second nozzle is separated from the substrate by a set distance.

31. The method of claim 5, wherein the deposition source, the first nozzle, the second nozzle, and the barrier wall assembly are movable relative to the substrate, or the substrate is movable relative to the deposition source, the first nozzle, the second nozzle, and the barrier wall assembly.

32. The method of claim 31, wherein a deposition material vaporized in the deposition source is deposited on the substrate while the deposition source, the first nozzle, the second nozzle, and the barrier wall assembly are moved relative to the substrate or while the substrate is moved relative to the deposition source, the first nozzle, the second nozzle, and the barrier wall assembly.

33. The method of claim 31, wherein the deposition source, the first nozzle, the second nozzle, and the barrier wall assembly are moved relative to the substrate along a plane parallel to a surface of the substrate, or the substrate is moved relative to the deposition source, the first nozzle, the second nozzle, and the barrier wall assembly along the plane.

34. The method of claim 1, wherein a thin film deposition apparatus comprises the thin deposition assembly and the thin film deposition apparatus comprises:
a deposition source that discharges a deposition material;
the first nozzle disposed at a side of the deposition source and including the first slits arranged in the first direction;
the second nozzle disposed opposite to the first nozzle and including the second slits arranged in a second direction perpendicular to the first direction; and
the adjusting member comprising an interval control member that adjusts an interval between the second nozzle and the substrate, and/or an alignment control member that adjusts an alignment between the second nozzle and the substrate,
wherein:
a deposition is performed while the substrate or the thin film deposition apparatus moves relative to each other in the first direction, and
the deposition source, the first nozzle and the second nozzle are integrally formed as one body.

35. The method of claim 34, wherein the adjusting member comprises the interval control member that adjusts the interval between the second nozzle and the substrate to be constant.

36. The method of claim 34, wherein the adjusting member comprises the interval control member, and wherein the interval control member comprises:
a sensor that senses a position of the second nozzle above the substrate; and
the actuator that provides a driving force to move the second nozzle above the substrate to adjust the interval according to the sensed position.

37. The method of claim 36, wherein the substrate comprises a positioning mark, and wherein the sensor senses the position of the second nozzle above the substrate based on the positioning mark.

38. The method of claim 37, further comprising an open mask arranged on the substrate not to overlap with the positioning mark.

39. The method of claim 34, wherein the actuator adjusts the interval between the second nozzle and the substrate by moving the second nozzle relative to the tray.

40. The method of claim 34, wherein the interval control member comprises:
a first actuator that is disposed between a side of the second nozzle and the tray to move the second nozzle relative to the tray;
a second actuator that is disposed between a side of the second nozzle opposite to the side of the second nozzle on which the first actuator is disposed and the tray to move the second nozzle relative to the tray; and
a third actuator that rotates the second nozzle with respect to an axis parallel to the first direction.

41. The method of claim 36, wherein the actuator comprises a piezoelectric motor.

42. The method of claim 36, wherein the actuator and the sensor adjust the interval between the second nozzle and the substrate by real-time feedback control.

43. The method of claim 34, wherein the adjusting member comprises the interval control member, and wherein the interval control member comprises rollers or balls that are disposed at opposite end portions of the second nozzle and contact the substrate.

44. The method of claim 34, wherein the adjusting member comprises the alignment control member that adjusts a position of the second nozzle relative to the substrate to be constant.

45. The method of claim 34, wherein the adjusting member comprises the alignment control member, and wherein the alignment control member comprises:
a sensor that senses a position of the second nozzle relative to the substrate; and
an actuator that provides a driving force to move the second nozzle relative to the substrate to adjust the alignment according to the sensed position.

46. The method of claim 45, wherein the substrate comprises a positioning mark, and wherein the sensor senses the position of the second nozzle relative to the substrate based on the positioning mark.

47. The method of claim 46, further comprising an open mask that is arranged on the substrate not to overlap with the positioning mark.

48. The method of claim 45, wherein the actuator adjusts the alignment between the second nozzle and the substrate by moving the second nozzle relative to the base frame.

49. The method of claim 45, wherein:
the actuator is disposed between a first side of the tray and the base frame to linearly move the tray relative to the base frame; and
the alignment control member further comprises another actuator that is disposed between a side of the tray adjacent to the first side and the base frame to rotatably move the tray relative to the base frame.

50. The method of claim 45, wherein the actuator comprises a piezoelectric motor.

51. The method of claim 45, wherein the actuator and the sensor adjust the alignment between the second nozzle and the substrate by real-time feedback control.

52. The method of claim 34, further comprising a connection member that integrally connects the deposition source, the first nozzle and the second nozzle as the one body.

53. The method of claim 52, wherein the connection member guides a flow of the deposition material from the deposition source, through the first and second nozzles, to the substrate.

54. The method of claim 52, wherein the connection member seals a space between the deposition source, the first nozzle, and the second nozzle.

55. The method of claim 34, wherein the deposition material discharged from the thin film deposition apparatus is continuously deposited on the substrate while one of the substrate or the thin film deposition apparatus is moved relative to the other one of the substrate and the thin film deposition apparatus in the first direction.

56. The method of claim 34, wherein the second nozzle is smaller than the substrate.

57. The method of claim 34, wherein the first slits are tilted at a set angle.

58. The method of claim 57, wherein the first slits comprise first slits that are arranged in two rows along the first direction, and wherein the first slits in each row tilt towards the first slits in the other row.

59. The method of claim 57, wherein:
the first slits comprise first slits that are arranged in two rows along the first direction;
the first slits of a first one of the two rows are arranged to face an end portion of the second nozzle opposite to a second row of the first slits; and
the first slits of the second row are arranged to face an end portion of the second nozzle opposite to the first row of the first slits.

60. The method of claim 1, wherein a thin film deposition apparatus comprises the thin film deposition assembly and the thin film deposition apparatus comprises:
a deposition source housing the deposition material;
the first nozzle including the first slits arranged in the first direction and through which the deposition material passes from the deposition source; and
the second nozzle disposed such that the first nozzle is between the second nozzle and the deposition source, the second nozzle including the second slits arranged in the first direction and through which the deposition material passes after passing through the first nozzle.

61. The method of claim 60, wherein the adjusting member further comprises a sensor set that detects the orientation, and controls the actuator set to adjust the orientation needed to deposit the deposition material on the deposition target area.

62. The method of claim 60, wherein the adjusting member further comprises a sensor set that senses a position of the second nozzle above the substrate, and controls the actuator set to adjust a distance between the substrate and the second nozzle.

63. The method of claim 60, wherein the adjusting member further comprises a sensor set that senses a position of the second nozzle relative to the substrate, and controls the actuator set to adjust a position of the second nozzle relative to the deposition target area by moving the second nozzle in a plane substantially parallel to a surface of the deposition target area.

64. The method of claim 63, wherein the adjusting member further controls the actuator set to adjust a distance between the substrate and the second nozzle.

65. The method of claim 60, further comprising a frame that holds the second nozzle, wherein the actuator set is disposed between the second nozzle and the frame.

66. The method of claim 60, further comprising a frame that holds the second nozzle, wherein the actuator set is disposed between the substrate and the frame and adjusts a distance between the second nozzle and the substrate.

67. The method of claim 66, further comprising another actuator set disposed between the second nozzle and the frame and which adjusts a position of the second nozzle relative to the deposition target area by moving the second nozzle in a plane substantially parallel to a surface of the deposition target area.

68. The method of claim 67, wherein the adjusting member further comprises a sensor set that detects the orientation, and controls the actuator set to adjust the orientation needed to deposit the deposition material on the deposition target area.

69. The method of claim 68, further comprising a barrier wall assembly including a plurality of barrier walls that are arranged in the first direction in order to partition a space between the first nozzle and the second nozzle.

70. The method of claim 68, further comprising a connector wall assembly that connects the first nozzle and the second nozzle to form an integrated single body.

71. A method of manufacturing a thin film on a substrate comprising:
passing vaporized deposition material through first slits of a first nozzle, the first slits being arranged in a first direction;
passing the vaporized deposition material received from the first slits through second slits of a second nozzle;
using an adjusting member comprising an actuator set to adjust an orientation of the second nozzle relative to a deposition target area on the substrate on which the deposition material from the second nozzle is to be deposited; and
depositing the deposition material from the second nozzle onto the deposition target area,
wherein the method utilizes a thin film deposition apparatus comprising:
a deposition source;
the first nozzle disposed at a side of the deposition source and including a plurality of the first slits arranged in the first direction;
the second nozzle disposed opposite to the first nozzle and including a plurality of the second slits arranged in the first direction;
a barrier wall assembly including a plurality of barrier walls that are arranged in the first direction in order to partition a space between the first nozzle and the second nozzle;
a base frame;
a tray that is arranged on the base frame and accommodates the second nozzle therein; and
the adjusting member comprising an interval control member that adjusts an interval between the second nozzle and the substrate, the interval control member comprising:
a sensor that senses a position of the second nozzle above the substrate; and
the actuator that provides a driving force to move the second nozzle relative to the substrate to adjust the interval according to the sensed position, and
wherein the actuator adjusts the interval between the second nozzle and the substrate by moving the second nozzle relative to the tray.

72. A method of manufacturing a thin film on a substrate comprising:
passing vaporized deposition material through first slits of a first nozzle, the first slits being arranged in a first direction;
passing the vaporized deposition material received from the first slits through second slits of a second nozzle;
using an adjusting member comprising an actuator set to adjust an orientation of the second nozzle relative to a deposition target area on the substrate on which the deposition material from the second nozzle is to be deposited; and
depositing the deposition material from the second nozzle onto the deposition target area, wherein the method utilizes a thin film deposition apparatus comprising:
- a deposition source;
- the first nozzle disposed at a side of the deposition source and including a plurality of the first slits arranged in the first direction;
- the second nozzle disposed opposite to the first nozzle and including a plurality of the second slits arranged in the first direction;
- a barrier wall assembly including a plurality of barrier walls that are arranged in the first direction in order to partition a space between the first nozzle and the second nozzle;
- a base frame;
- a tray that is arranged on the base frame and accommodates the second nozzle therein; and
- the adjusting member comprising an alignment control member that adjusts an alignment between the second nozzle and the substrate, the alignment control member comprising:
  - a sensor that senses a position of the second nozzle above the substrate; and
  - the actuator that provides a driving force to move the second nozzle relative to the substrate to adjust the alignment according to the sensed position, and
  - wherein the actuator adjusts the alignment between the second nozzle and the substrate by moving the second nozzle relative to the base frame.

73. A method of manufacturing a thin film on a substrate comprising:
- disposing the substrate at a preset distance from a thin film deposition assembly;
- passing vaporized deposition material through first slits of a first nozzle of the thin film deposition assembly, the first slits being arranged in a first direction;
- passing the vaporized deposition material received from the first slits through second slits of a second nozzle of the thin film deposition assembly;
- using an adjusting member comprising an actuator set to adjust an orientation of the second nozzle relative to a deposition target area on the substrate on which the deposition material from the second nozzle is to be deposited; and
- depositing the deposition material from the second nozzle onto the deposition target area while the thin film deposition assembly or the substrate is moved relative to the other of the thin film deposition assembly and the substrate, the second nozzle defining a pattern of deposition material on the substrate,
- wherein the actuator set adjusts an orientation of the second nozzle by moving the second nozzle relative to a base frame and a tray accommodating the second nozzle, the tray being arranged on the base frame.

* * * * *